(12) United States Patent
Fukumoto et al.

(10) Patent No.: US 10,651,062 B2
(45) Date of Patent: May 12, 2020

(54) SUBSTRATE TREATING APPARATUS

(71) Applicant: SCREEN Holdings Co., Ltd., Kyoto (JP)

(72) Inventors: Yasuhiro Fukumoto, Kyoto (JP); Yuji Tanaka, Kyoto (JP); Tomohiro Matsuo, Kyoto (JP); Takeharu Ishii, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 3 days.

(21) Appl. No.: 15/904,559

(22) Filed: Feb. 26, 2018

(65) Prior Publication Data
US 2018/0269084 A1    Sep. 20, 2018

(30) Foreign Application Priority Data

Mar. 16, 2017 (JP) ................. 2017-051516

(51) Int. Cl.
*H01L 21/67* (2006.01)
*B05C 11/00* (2006.01)
(Continued)

(52) U.S. Cl.
CPC ........ *H01L 21/67109* (2013.01); *B05C 11/00* (2013.01); *F16J 15/002* (2013.01);
(Continued)

(58) Field of Classification Search
CPC ........ H01L 21/67109; H01L 21/67126; H01L 21/67248; H01L 21/6719; H01L 21/68742;
(Continued)

(56) References Cited

U.S. PATENT DOCUMENTS 6,030,457 A    2/2000    Shimazu et al. ............... 118/715
6,042,623 A *  3/2000    Edwards ........... H01L 21/67751
                                              29/25.01
(Continued)

FOREIGN PATENT DOCUMENTS

JP    H10-321532 A    12/1998
JP    2007-318010 A    12/2007
JP    2014-22570 A    2/2014

OTHER PUBLICATIONS

Office Action dated Jan. 16, 2019 for corresponding Korean Patent Application No. 10-2018-0023779.
(Continued)

*Primary Examiner* — Laura Edwards
(74) *Attorney, Agent, or Firm* — Ostrolenk Faber LLP

(57) ABSTRACT

Disclosed is a substrate treating apparatus including a treatment container, a pin, a seal housing, a seal member, and an exhaust port. The treatment container includes an opening. The pin is disposed between an interior of the treatment container and an exterior of the treatment container through the opening, and is configured to reciprocate along an axis thereof. The seal housing is disposed in the exterior of the treatment container. The seal housing is in close contact with the treatment container around the opening, and accommodates a part of the pin. The seal member is in close contact with an inner peripheral surface of the seal housing, and in close contact with an outer peripheral surface of the pin so as to be slidable relative to the pin. The exhaust port is in connection with the seal housing in a communicated manner.

23 Claims, 13 Drawing Sheets

(51) Int. Cl.
*G03F 7/00* (2006.01)
*F16J 15/00* (2006.01)
*F16J 15/3284* (2016.01)
*F24H 3/02* (2006.01)
*H01L 21/687* (2006.01)
*F16J 15/3268* (2016.01)

(52) U.S. Cl.
CPC ....... *F16J 15/3268* (2013.01); *F16J 15/3284* (2013.01); *F24H 3/02* (2013.01); *G03F 7/0002* (2013.01); *H01L 21/6719* (2013.01); *H01L 21/67126* (2013.01); *H01L 21/67248* (2013.01); *H01L 21/67253* (2013.01); *H01L 21/68742* (2013.01)

(58) Field of Classification Search
CPC ......... H01L 21/67253; H01L 21/67098; F24H 3/02; G03F 7/0002; F16J 15/3268; F16J 15/3284; F16J 15/002; B05C 11/00; B01J 3/03
USPC .......................... 118/728, 730, 500; 438/490; 156/345.52, 345.53, 345.55; 134/902
See application file for complete search history.

(56) References Cited

U.S. PATENT DOCUMENTS

| | | | |
|---|---|---|---|
| 2006/0219178 A1 | 10/2006 | Asakura | 118/728 |
| 2007/0040041 A1 | 2/2007 | Le et al. | 236/1 |
| 2008/0210680 A1 | 9/2008 | Hayashi et al. | 219/444.1 |
| 2013/0039733 A1* | 2/2013 | Webb | H01L 21/67132 414/752.1 |
| 2014/0022521 A1 | 1/2014 | Harumoto et al. | 355/27 |
| 2014/0086711 A1* | 3/2014 | Scholte Von Mast | H01L 21/6719 414/222.01 |
| 2015/0318146 A1 | 11/2015 | Kim | |

OTHER PUBLICATIONS

Office Action dated Oct. 1, 2018 for corresponding Taiwan Patent Application No. 107103951.

* cited by examiner

SUBSTRATE TREATING APPARATUS

CROSS-REFERENCE TO RELATED APPLICATIONS

This application claims priority to Japanese Patent Application No. 2017-051516 filed Mar. 16, 2017, the disclosure of which is hereby incorporated herein by reference in its entirety for all purposes.

BACKGROUND OF THE INVENTION

Field of the Invention

The present invention relates to a substrate treating apparatus for treating a substrate. Examples of the substrate include a semiconductor wafer, a substrate for photomask, a substrate for liquid crystal display, a substrate for plasma display, a substrate for organic EL, a substrate for field emission display (FED), a substrate for optical display, a magnetic disk substrate, an optical disk substrate, an optical magnetic disk substrate, and a solar cell substrate.

Description of the Related Art

Japanese Unexamined Patent Publication No. 2014-22570A discloses a substrate treating apparatus for performing a heat treatment of a substrate. The substrate treating apparatus includes a plate and a lid. The substrate is placed on the plate. The plate heats the substrate placed on the plate. A space above the plate is a treating space for treating the substrate. The lid is movable between an upper position and a lower position. When the lid is located at the upper position, the treating space is opened. When the lid is located at the lower position, the treating space is sealed.

The plate includes through holes, recesses, and a seal member. The through holes are formed in the plate. The recesses are each formed at upper ends of the through holes, respectively. The seal member is attached to the recesses. The seal member is, for example, an O-ring.

The substrate treating apparatus includes support pins, and a support pin lifting mechanism. The support pins are disposed in the through holes, respectively. The support pins each include a tip end. The tip end is discal. The support pins include proximal ends, respectively, that are located below the plate. The support pin lifting mechanism is connected to the proximal ends of the support pins. The support pin lifting mechanism moves the support pins to an upper position and a lower position. When the support pins are located at the upper position, the tip ends are located above the plate. When the support pins are located at the upper position, the support pins support the substrate. When the support pins are located at the lower position, the tip ends of the support pins are accommodated into the recesses, respectively. The tip ends of the support pins located at the lower position adhere to the recesses via the seal member. Adhesion of the tip ends of the support pins to the seal member causes the tip ends of the support pins to separate the treating space and the through holes. The treating space is isolated from the through holes.

The substrate treating apparatus includes an inlet and an outlet. The inlet guides a solvent and inert gas into the treating space. The outlet exhausts gas within the treating space.

The following describes a procedure of the heat treatment by the substrate treating apparatus. Firstly, the substrate is loaded into the treating space. Specifically, the lid is moved to the upper position. This causes the treating space to be opened. Then, the support pins are moved to the upper position, and receive the substrate from an external transport mechanism. Thereafter, the support pins are moved to the lower position. This causes the substrate to be placed on the plate. The support pins adhere to the recesses via the seal member. The treating space is isolated from the through holes. Then, the lid is moved to the lower position. This causes the treating space to be sealed.

Thereafter, the substrate is subjected to the heat treatment. Specifically, a solvent is supplied to the treating space via the inlet, and the plate heats the substrate. The plate heats the substrate at a temperature controlled to be room temperatures or more and 250 degrees or less. In addition, the gas within the treating space is exhausted via the outlet. This makes negative pressure of the gas within the treating space.

After a given period of time elapses from start of the heat treatment, the solvent in the treating space is replaced by inert gas. Specifically, supply of the solvent via the inlet is stopped, and the inert gas is supplied into the treating space via the inlet.

Subsequently, the substrate is unloaded from the treating space. Specifically, exhaust of the gas via the outlet is stopped. This causes the pressure of the gas within the treating space to return back to normal pressure. Then, the lid is moved to the upper position. This causes the treating space to be opened. The support pins are moved to the upper position while supporting the substrate. Then, the external transport mechanism receives the substrate from the support pins.

SUMMARY OF THE INVENTION

The currently-used substrate treating apparatus may possess a possibility of lowering airtightness of the treating space under strict treatment conditions.

For instance, if the substrate is heated at much higher temperatures, airtightness of the treating space may possibly be lowered. Specifically, heating of the substrate by the plate at much higher temperatures leads to an excessively higher temperature of the seal member. The seal member of the excessively higher temperature causes degradation thereof. If the seal member is degraded, the tip ends of the support pins fail to adhere to the recesses in an appropriate manner. That is, the degraded seal member causes lowered airtightness of the treating space.

For instance, if the pressure of the gas within the treating space is lowered, the airtightness of the treating space may possibly be lowered. Specifically, if the pressure of the gas within the treating space is lowered, pressure of the gas within the through holes is heightened relatively to the pressure of the gas within the treating space. Accordingly, a difference in pressure between the treating space and the through holes exert upward force on the tip ends of the support pins. A larger difference in pressure between the treating space and the through holes increases the upward force on the tip ends of the support pins. If the upward force on the tip ends of the support pins is increased, the tip ends of the support pins may float from the seal member. If the tip ends of the support pins come off from the seal member, the treating space is brought into communication with the through holes. If the treating space is in communication with the through holes, the airtightness of the treating space is lowered.

The present invention has been made regarding the state of the art noted above, and its one object is to provide a substrate treating apparatus that achieves enhanced airtightness of a treatment container.

The present invention is constituted as stated below to achieve the above object. One aspect of the present invention provides a substrate treating apparatus. The substrate treating apparatus includes a treatment container having a first opening and configured to treat a substrate, a first shaft member that is disposed between an interior of the treatment container and an exterior of the treatment container through the first opening, and that is configured to reciprocate in an axis direction of the first shaft member, a first seal housing that is disposed in the exterior of the treatment container, that is in close contact with the treatment container around the first opening, and that accommodates a part of the first shaft member, a first seal member that is in close contact with an inner peripheral surface of the first seal housing, and that is in close contact with an outer peripheral surface of the first shaft member so as to be slidable relative to the first shaft member, and a first exhaust port that is in connection with the first seal housing in a communicated manner, and that is configured to exhaust gas within the first seal housing.

The first seal housing accommodates a part of the first shaft member. The first seal housing adheres to the treatment container around the first opening. Moreover, the first seal housing also adheres to the first seal member. The first seal member adheres to the first shaft member. This causes the first opening of the treatment container to be sealed with the first seal housing and the first seal member. Accordingly, enhanced airtightness of the treatment container is obtainable suitably. In addition, even when the first shaft member slides relative to the first seal member, the first shaft member still adheres to the first seal member continuously. Consequently, the airtightness of the treatment container is able to be maintained suitably even when the first shaft member reciprocates.

Since the first seal housing is disposed in the exterior of the treatment container, the first seal member is also disposed in the exterior of the treatment container. The first seal member is disposed in the exterior of the treatment container, and accordingly, the first seal member does not receive heat within the treatment container directly. In other words, the first seal member is suitably protectable from the heat within the treatment container. This achieves suitable prevention of the degradation of the first seal member. That is, the first seal member possesses a suitably maintained seal function. Consequently, the airtightness of the treatment container is able to be maintained suitably.

As noted above, the substrate treating apparatus according achieves enhanced airtightness of the treatment container.

Moreover, the first seal housing is in connection with the first exhaust port in a communicated manner. The gas in the interior of the first seal housing is exhausted to the exterior of the first seal housing through the first exhaust port. Accordingly, this prevents foreign substances such as dust or outside air from entering into the treatment container through the first opening. As a result, an atmosphere in the treatment container is controllable suitably.

It is preferred in the aspect of the substrate treating apparatus that the first seal member is made of metal. The first seal member made of metal possesses high heat resistance. Accordingly, the first seal member achieves the maintained seal function more suitably. This leads to more suitably maintained airtightness of the treatment container.

It is preferred in the aspect of the substrate treating apparatus that the treatment container and the first seal housing are in communication with each other via the first opening. That is, the interior of the treatment container is in communication with the interior of the first seal housing. Consequently, the gas within the treatment container is able to be exhausted through the exhaust port. This lowers pressure within the treatment container more easily. In addition, an atmosphere in the treatment container is controllable more suitably.

It is preferred that the substrate treating apparatus according to the aspect further includes a heating unit that is disposed in the interior of the treatment container, and that is configured to heat the substrate. The heating unit includes a through hole formed in the heating unit. The first shaft member is disposed in the through hole. Accordingly, the first shaft member receives heat of the heating unit directly. However, the first seal member is disposed in the exterior of the treatment container, and thus does not receive heat of the heating unit directly. That is, the first seal member is protectable from the heat of the heating unit suitably. As a result, even if the first shaft member has relatively high temperatures, the first seal member is able to adhere to the first shaft member without any degradation of the first seal member. This suitably maintains the airtightness of the treatment container. As noted above, the substrate treating apparatus possesses especially high usability when the first shaft members are disposed in the through hole of the heating unit.

It is preferred in the aspect of the substrate treating apparatus that the first seal housing is in communication with the through hole. The through hole is in communication with the interior of the first seal housing. Accordingly, gas within the through holes is able to be exhausted through the exhaust port. This achieves suitable control of the gas within the through hole.

It is preferred in the aspect of substrate treating apparatus that the treatment container further includes a second opening, and the substrate treating apparatus further includes a second shaft member that is disposed between the interior of the treatment container and the exterior of the treatment container through the second opening, and that is configured to reciprocate in an axis direction of the second shaft member. The first seal housing is in close contact with the treatment container around the second opening, and accommodates a part of the second shaft member. The substrate treating apparatus further includes a second seal member that is in close contact with an inner peripheral surface of the first seal housing, and that is in close contact with an outer peripheral surface of the second shaft member so as to be slidable relative to the second shaft member.

The first seal housing accommodates a part of the second shaft member. The first seal housing adheres to the treatment container around the second opening. Moreover, the first seal housing adheres to the second seal member. The second seal member adheres to the second shaft member. Accordingly, the first opening and the second opening of the treatment container are sealed with the first seal housing, the first seal member and the second seal member. Accordingly, this achieves suitably enhanced airtightness of the treatment container. In addition, even when the second shaft member slides relative to the second seal member, the second shaft member continuously adheres to the second seal member. Consequently, the airtightness of the treatment container is able to be maintained suitably even when the second shaft member reciprocates.

The one first seal housing accommodates the two shaft members (i.e., the first shaft member and the second shaft member). The one first seal housing adheres to the two seal members (i.e., the first seal member and the second seal member). Accordingly, two shaft sealings (i.e., seal of the first shaft member and seal of the second shaft member) are performable in the one first seal housing. This simplifies the configuration of the substrate treating apparatus.

Since the first seal housing is disposed in the exterior of the treatment container, the second seal member is also disposed in the exterior of the treatment container. The second seal member is disposed in the exterior of the treatment container, and accordingly, the second seal member is protectable from heat in the treatment container. This suitably prevents degradation of the second seal member. Consequently, the airtightness of the treatment container is able to be maintained suitably.

The gas in the interior of the first seal housing is exhausted to the exterior of the first seal housing through the first exhaust port. Accordingly, this prevents foreign substances such as dust or outside air from entering into the treatment container through at least either the first opening or the second opening. As a result, an atmosphere in the treatment container is controllable suitably.

It is preferred in the aspect of the substrate treating apparatus that the first seal housing includes an aggregated part or collector that is in close contact with the treatment container around the first opening and the second opening, a first cylinder that is in connection with the aggregated part in a communicated manner, and a second cylinder that is in connection with the aggregated part in a communicated manner. A part of the first shaft member is accommodated into the aggregated part and the first cylinder, and a part of the second shaft member is accommodated into the aggregated part and the second cylinder. The first seal member is in close contact with an inner peripheral surface of the first cylinder, and the second seal member is in close contact with an inner peripheral surface of the second cylinder. The first exhaust port is in connection with the aggregated part in a communicated manner.

Since the first seal housing includes the first cylinder, the first seal member is able to be placed suitably in the first cylinder. Since the first seal housing includes the second cylinder, the second seal member is able to be placed suitably in the second cylinder. Since the first seal housing includes the aggregated part, the interior of the aggregated part is able to be in communication with the interior of the first cylinder and the interior of the second cylinder suitably. Since the exhaust port is in connection with the aggregated part in a communicated manner, the gas within the aggregated part, the gas within the first cylinder, and the gas within the second cylinder are able to be exhausted through the one first exhaust port.

It is preferred in the aspect of the substrate treating apparatus that the first cylinder is separable from the aggregated part, and the second cylinder is separable from the aggregated part. The first cylinder is separable from the aggregated part, and accordingly, the first cylinder, the first seal member, and the first shaft member are integrally separable from the aggregated part. Accordingly, maintenance of the substrate treating apparatus is performable without separation of the first seal member from the first cylinder and the first shaft member. This leads to reduction in replacement frequency of the first seal member. Likewise, the second cylinder is separable from the aggregated part. Accordingly, the second cylinder, the second seal member, and the second shaft member are integrally separable from the aggregated part. Accordingly, maintenance of the substrate treating apparatus is performable without separation of the second seal member from the second cylinder and the second shaft member. This leads to reduction in replacement frequency of the second seal member.

It is preferred in the aspect of the substrate treating apparatus that the aggregated part includes a first pipe that extends between the first shaft member and the second shaft member in a direction substantially orthogonal to the axis direction of the first shaft member. The first pipe extends in the direction substantially orthogonal to the axis direction of the first shaft member, leading to a relatively shorted length of the first pipe. Consequently, a simplified configuration of the aggregated part is obtainable.

It is preferred in the aspect that the substrate treating apparatus further includes a cooling unit that is disposed adjacent to the first seal housing. The cooling unit cools the first seal housing. Since the first seal housing adheres to the first seal member, the cooling unit additionally cools the first seal member. That is, the excessively heightened temperature of the first seal member is preventable. This suitably prevents degradation of the first seal member. Consequently, the airtightness of the treatment container is able to be maintained suitably.

Another aspect of the present invention provides a substrate treating apparatus. The substrate treating apparatus includes a treatment container having a first opening and configured to treat the substrate, a first shaft member that is disposed between an interior of the treatment container and an exterior of the treatment container through the first opening, and that is configured to reciprocate in an axis direction of the first shaft member, a sealing mechanism configured to seal the first opening while allowing reciprocation of the first shaft member, and a cooling unit disposed adjacent to the sealing mechanism. The sealing mechanism includes a first seal housing that is disposed in the exterior of the treatment container, that is in close contact with the treatment container around the first opening, and that accommodates a part of the first shaft member, and a first seal member that is in close contact with an inner peripheral surface of the first seal housing, and that is in close contact with an outer peripheral surface of the first shaft member so as to be slidable relative to the first shaft member.

The first seal housing accommodates a part of the first shaft member. The first seal housing adheres to the treatment container around the first opening. Moreover, the first seal housing adheres to the first seal member. The first seal member adheres to the first shaft member. Accordingly, the first opening of the treatment container is sealed with the first seal housing and the first seal member. Accordingly, this achieves suitably enhanced airtightness of the treatment container. In addition, even when the first shaft member slides relative to the first seal member, the first shaft member continuously adheres to the first seal member. Consequently, the airtightness of the treatment container is able to be maintained suitably even when the first shaft member reciprocates.

Since the first seal housing is disposed in the exterior of the treatment container, the first seal member is also disposed in the exterior of the treatment container. The first seal member is disposed in the exterior of the treatment container, and thus does not receive heat within the heating unit directly. That is, the first seal member is protectable from the heat within the heating unit suitably. This suitably prevents degradation of the first seal member. In other words, the first seal member achieves the maintained seal function more suitably. Consequently, the airtightness of the treatment container is able to be maintained suitably.

Since the cooling unit is disposed adjacent to the sealing mechanism, the cooling unit is able to cool the first seal housing and the first seal member suitably. That is, the excessively heightened temperature of the first seal member is preventable. This suitably prevents degradation of the first seal member. Consequently, the airtightness of the treatment container is able to be maintained suitably.

The substrate treating apparatus according to the aspect mentioned above achieves enhanced airtightness of the treatment container.

It is preferred in the aspect of the substrate treating apparatus that the cooling unit surrounds the first seal housing. Since the cooling unit surrounds the first seal housing, the cooling unit allows cooling of a wide area of the first seal housing. Consequently, the cooling unit performs effective cooling of the first seal housing.

It is preferred in the aspect of the substrate treating apparatus that the cooling unit includes a cooling channel through which cooling water flows. Since the cooling unit includes the cooling channel, heat of the first seal housing is transmitted to the cooling water effectively. This causes the cooling unit to cool the first seal housing effectively.

It is preferred in the aspect of the substrate treating apparatus that the first seal housing is made of metal. Since the first seal housing is made of metal, the cooling unit allows effective cooling of the first seal housing.

In the substrate treating apparatus mentioned above, it is preferred that the first seal member is made of metal. Since the first seal member is made of metal, the cooling unit allows effective cooling of the first seal member. Moreover, since the first seal member is made of metal, the first seal member has high heat resistance. Consequently, the first seal member is able to maintain its seal function more suitably. This leads to more suitable maintenance of the airtightness of the treatment container.

It is preferred that the substrate treating apparatus further includes a heating unit that is disposed in the interior of the treatment container, and that is configured to heat the substrate, and the heating unit includes a through hole that is formed in the heating unit, and the first shaft member is disposed in the through hole. Since the first shaft member is disposed in the through hole of the heating unit, the first shaft member directly receives heat of the heating unit. On the other hand, the first seal member is disposed in the exterior of the treatment container, the first seal member does not receive heat of the heating unit directly. In other words, the first seal member is suitably protectable from the heat of the heating unit. Consequently, even if the first shaft member has relatively high temperatures, the first seal member is able to adhere to the first shaft member without any degradation of the first seal member. Moreover, the cooling unit suppresses the excessively heightened temperature of an adhesion portion between the first seal member and the first shaft member. Accordingly, degradation of the first seal member is suitably avoidable. This allows suitable maintenance of the airtightness of the treatment container. As above, the present substrate treating apparatus possesses especially high usability when the first shaft member is disposed in the through hole of the heating unit.

It is preferred in the substrate treating apparatus mentioned above that the treatment container includes a second opening, and the substrate treating apparatus further includes a second shaft member that is disposed between the interior of the treatment container and the exterior of the treatment container through the second opening, and that is configured to reciprocate in an axis direction of the second shaft member. The first seal housing is in close contact with the treatment container around the second opening, and accommodates a part of the second shaft member. The sealing mechanism includes a second seal member that is in close contact with an inner peripheral surface of the first seal housing, and is in close contact with an outer peripheral surface of the second shaft member so as to be slidable relative to the second shaft member.

The first seal housing accommodates a part of the second shaft member. The first seal housing adheres to the treatment container around the second opening. Moreover, the first seal housing adheres to the second seal member. The second seal member adheres to the second shaft member. Accordingly, the first opening and the second opening of the treatment container are sealed with the first seal housing, the first seal member, and the second seal member. Consequently, this suitably enhances the airtightness of the treatment container. Moreover, the second shaft member and the second seal member adhere to each other continuously even when the second shaft member slides relative to the second seal member. As a result, the airtightness of the treatment container is suitably maintainable even when the second shaft member reciprocates.

The one first seal housing accommodates the two shaft members (i.e., the first shaft member and the second shaft member). The one first seal housing adheres to the two seal members (i.e., the first seal member and the second seal member). Accordingly, two shaft sealings (i.e., sealing of the first shaft member and sealing of the second shaft member) are performable in the one first seal housing. This simplifies the configuration of the sealing mechanism.

Since the first seal housing is disposed in the exterior of the treatment container, the second seal member is also disposed in the exterior of the treatment container. Since the second seal member is disposed in the exterior of the treatment container, the second seal member is suitably protective from heat within the treatment container. Accordingly, degradation of the second seal member suitably is avoidable. This allows suitable maintenance of the airtightness of the treatment container.

Since the cooling unit is disposed adjacent to the sealing mechanism, the cooling unit is able to cool the second seal member suitably. That is, the excessively heightened temperature of the second seal member is preventable. This suitably prevents degradation of the second seal member. Consequently, the airtightness of the treatment container is able to be maintained suitably.

It is preferred in the aspect of the substrate treating apparatus that the first seal housing includes an aggregated part that is in close contact with the treatment container around the first opening and the second opening, a first cylinder that is in connection with the aggregated part in a communicated manner, and a second cylinder that is in connection with the aggregated part in a communicated manner. A part of the first shaft member is accommodated into the aggregated part and the first cylinder, a part of the second shaft member is accommodated into the aggregated part and the second cylinder, the first seal member is in close contact with an inner peripheral surface of the first cylinder, the second seal member is close contact with an inner peripheral surface of the second cylinder, and the cooling unit is disposed adjacent to the aggregated part.

The first seal housing is provided with the first cylinder, leading to appropriate location of the first seal member in the first cylinder. In addition, the first seal housing is provided with the second cylinder, leading to appropriate location of the second seal member in the second cylinder. The first seal housing is additionally provided with the aggregated part, leading to suitable communication among an interior of the aggregated part, an interior of the first cylinder, and an interior of the second cylinder. Moreover, the cooling unit is disposed adjacent to the aggregated part, leading to suitable cooling of the aggregated part and the first and second cylinders.

It is preferred in the aspect of the substrate treating apparatus that the first cylinder is separable from the aggregated part, and the second cylinder is separable from the aggregated part. The first cylinder is separable from the aggregated part, which causes the first seal member integrated with the first cylinder and the first shaft member to be separated from the aggregated part. Accordingly, maintenance is performable to the substrate treating apparatus without any separation of the first seal member from the first cylinder and first shaft member. This leads to reduction in replacement frequency of the first seal member. Likewise, the second cylinder is separable from the aggregated part, which causes the second seal member integrated with the second cylinder, and the second shaft member to be separated from the aggregated part. Accordingly, maintenance is performable to the substrate treating apparatus without any separation of the second seal member from the second cylinder and second shaft member. This leads to reduction in replacement frequency of the second seal member.

It is preferred in the aspect of the substrate treating apparatus that the aggregated part includes a first pipe that extends between the first shaft member and the second shaft member in a direction substantially orthogonal to the axis direction of the first shaft member. The first pipe extends in the direction substantially orthogonal to the axis direction of the first shaft member, leading to a relatively shortened length of the first pipe. This simplifies the configuration of the aggregated part.

The present specification also discloses other inventions as under according to the substrate treating apparatus.

(1) That is, in the substrate treating apparatus mentioned above, the treatment container includes a second opening. The substrate treating apparatus includes a second shaft member, a second seal housing, a second seal member, and a second exhaust port. The second shaft member is disposed between the interior of the treatment container and the exterior of the treatment container through the second opening, and is configured to reciprocate in an axis direction of the second shaft member. The second seal housing is disposed in the exterior of the treatment container, is in close contact with the treatment container around the second opening, and accommodates a part of the second shaft member. The second seal member is in close contact with an inner peripheral surface of the second seal housing, and is in close contact with an outer peripheral surface of the second shaft member so as to be slidable relative to the second shaft member. The second exhaust port that is in connection with the second seal housing in a communicated manner, and is configured to exhaust gas within the second seal housing.

With the substrate treating apparatus according to Aspect (1) of the present invention, the second seal housing accommodates a part of the second shaft member. The second seal housing adheres to the treatment container around the second opening. The second seal housing also adheres to the second seal member. The second seal member adheres to the second shaft member. Accordingly, the second opening of the treatment container is sealed with the second seal housing and the second seal member. This suitably enhances airtightness of the treatment container. Moreover, the second shaft member continuously adheres to the second seal member even when the second shaft member slides relative to the second seal member. Consequently, the airtightness of the treatment container is suitably maintainable even when the second shaft member reciprocates.

Moreover, the first seal housing adheres to one seal member (i.e., the first seal member). This simplifies the configuration of the first seal housing. The second seal housing adheres to one seal member (i.e., the second seal member). This simplifies the configuration of the second seal housing.

The second seal housing is disposed in the exterior of the treatment container, and accordingly, the second seal member is also disposed in the exterior of the treatment container. Since the second seal member is disposed in the exterior of the treatment container, the second seal member is suitably protective from heat within the treatment container. Accordingly, degradation of the second seal member is suitably avoidable. This allows suitable maintenance of the airtightness of the treatment container.

The gas in the interior of the second seal housing is exhausted to the exterior of the second seal housing through the second exhaust port. Accordingly, this prevents foreign substances such as dust or outside air from entering into the treatment container through the second opening. As a result, an atmosphere in the treatment container is controllable suitably.

(2) In the substrate treating apparatus, the treatment container includes a second opening. The substrate treating apparatus further includes a second shaft member that is disposed between the interior of the treatment container and the exterior of the treatment container through the second opening, and reciprocates in an axis direction of the second shaft member. The sealing mechanism includes a second seal housing and a second seal member. The second seal housing is disposed in the exterior of the treatment container, is in close contact with the treatment container around the second opening, and accommodates a part of the second shaft member. The second seal member is in close contact with an inner peripheral surface of the second seal housing, and is in close contact with an outer peripheral surface of the second shaft member so as to be slidable relative to the second shaft member.

With the substrate treating apparatus according to Aspect (2) of the present invention, the second seal housing accommodates a part of the second shaft member. The second seal housing adheres to the treatment container. The second seal housing also adheres to the second seal member. The second seal member adheres to the second shaft member. Accordingly, the second opening of the treatment container is sealed with the second seal housing and the second seal member. This suitably enhances airtightness of the treatment container. Moreover, the second shaft member continuously adheres to the second seal member even when the second shaft member slides relative to the second seal member. Consequently, the airtightness of the treatment container is suitably maintainable even when the second shaft member reciprocates.

Moreover, the first seal housing adheres to one seal member (i.e., the first seal member). This simplifies the configuration of the first seal housing. The second seal housing adheres to one seal member (i.e., the second seal member). This simplifies the configuration of the second seal housing.

The second seal housing is disposed in the exterior of the treatment container, and accordingly, the second seal member is also disposed in the exterior of the treatment container. Since the second seal member is disposed in the exterior of the treatment container, the second seal member is suitably protective from heat within the treatment container. Accordingly, degradation of the second seal member is suitably avoidable. This allows suitable maintenance of the airtightness of the treatment container.

Since the cooling unit is disposed adjacent to the sealing mechanism, the cooling unit is able to cool the second seal housing and the second seal member suitably. That is, the excessively heightened temperature of the second seal member is preventable. This suitably prevents degradation of the second seal member. Consequently, the airtightness of the treatment container is able to be maintained suitably.

BRIEF DESCRIPTION OF DRAWINGS

For the purpose of illustrating the invention, there are shown in the drawings several forms which are presently preferred, it being understood, however, that the invention is not limited to the precise arrangement and instrumentalities shown.

DESCRIPTION OF EMBODIMENTS

The following describes a substrate treating apparatus according to one embodiment of the present invention with reference to drawings.

1. Configuration of Substrate Treating Apparatus

Figure 1:
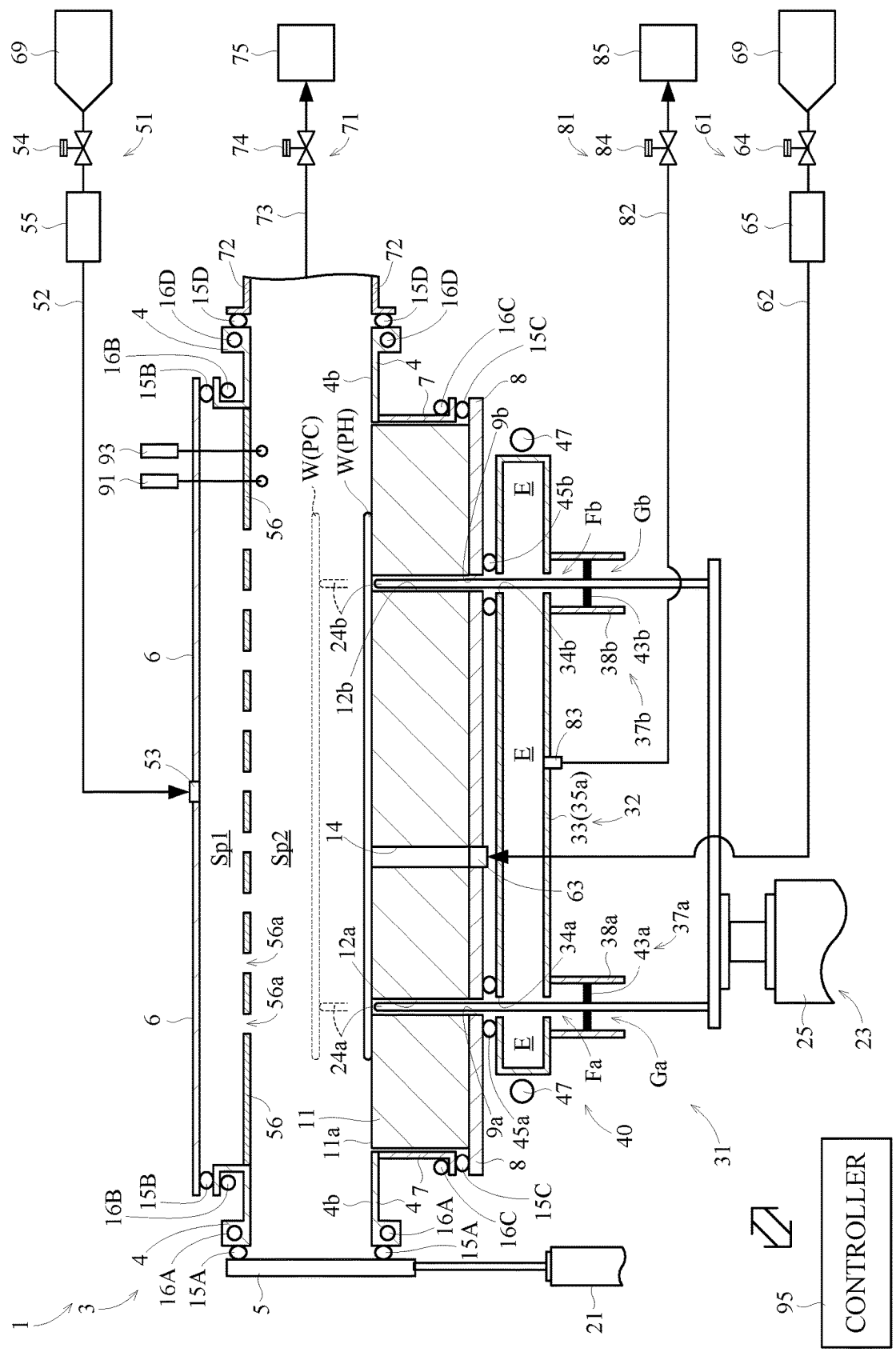
FIG. 1 schematically illustrates a configuration of a substrate treating apparatus.

FIG. 1 schematically illustrates a substrate treating apparatus. The substrate treating apparatus 1 according to one embodiment of the present invention performs treatment of a substrate (e.g., semiconductor wafer) W. The treatment by the substrate treating apparatus 1 is a heat treatment. The heat treatment contains heating of the substrate W and cooling of the substrate W. The following describes each element of the substrate treating apparatus 1.

1-1. Treatment Container and Heating Unit

The substrate treating apparatus 1 includes a treatment container 3 for treating a substrate W. The treatment container 3 accommodates one substrate W. The treatment container 3 performs a heat treatment of the substrate W in the interior thereof.

Figure 2:
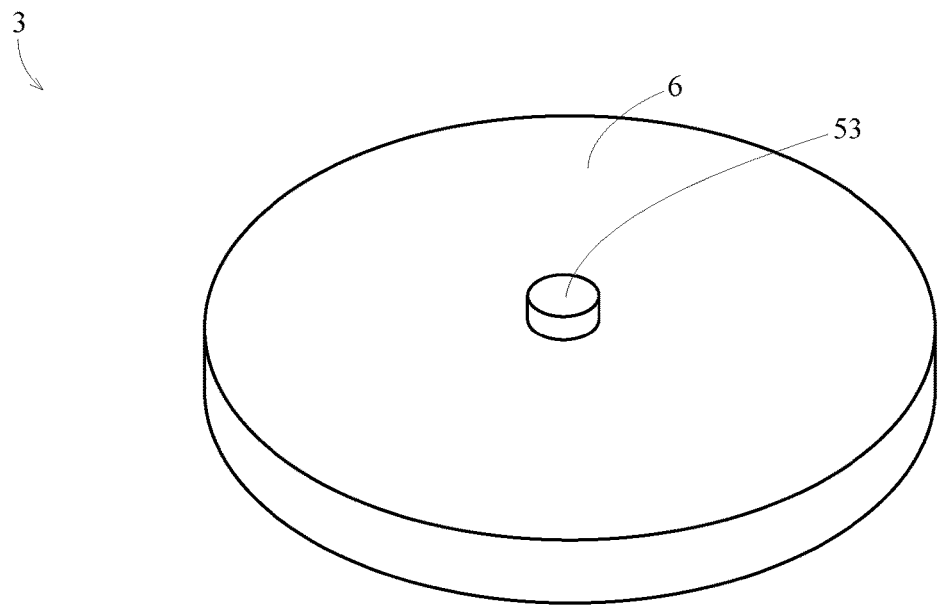
FIG. 2 partially illustrate s an exploded perspective view of a treatment container.
Figure 2:
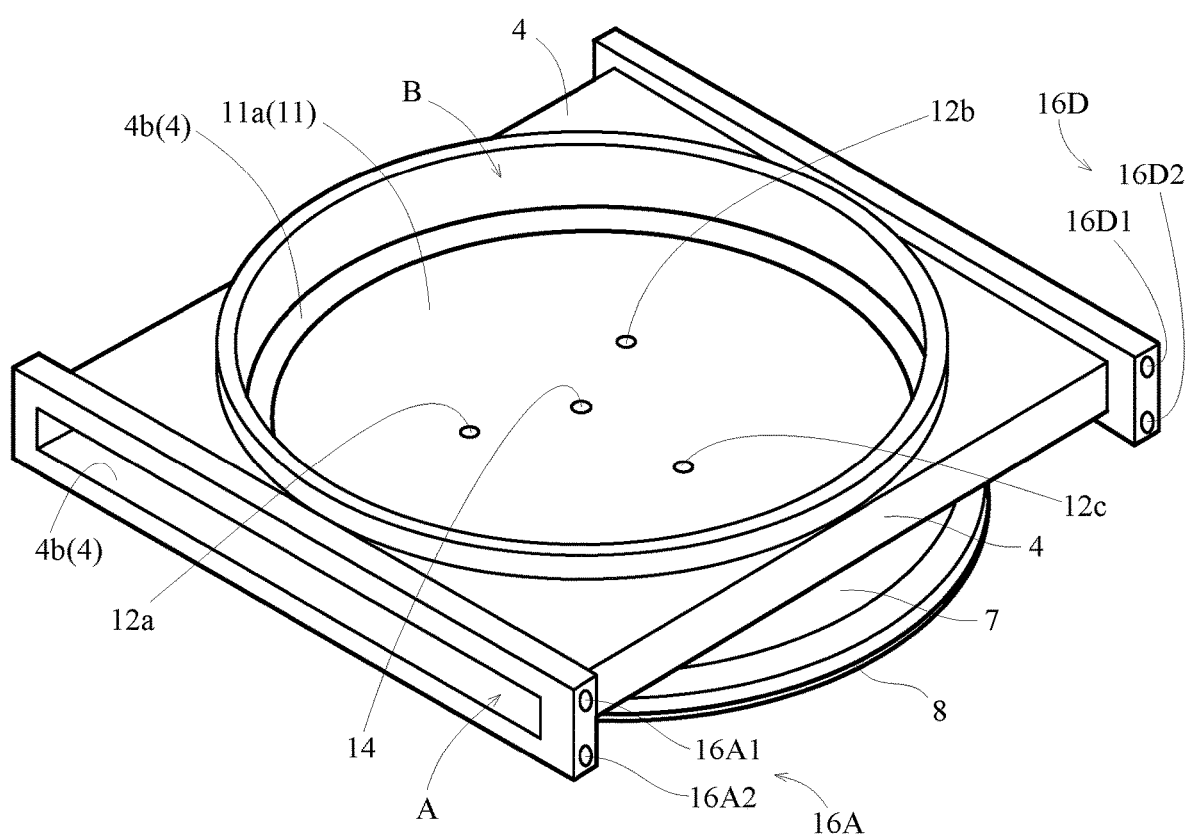
Figure 3:
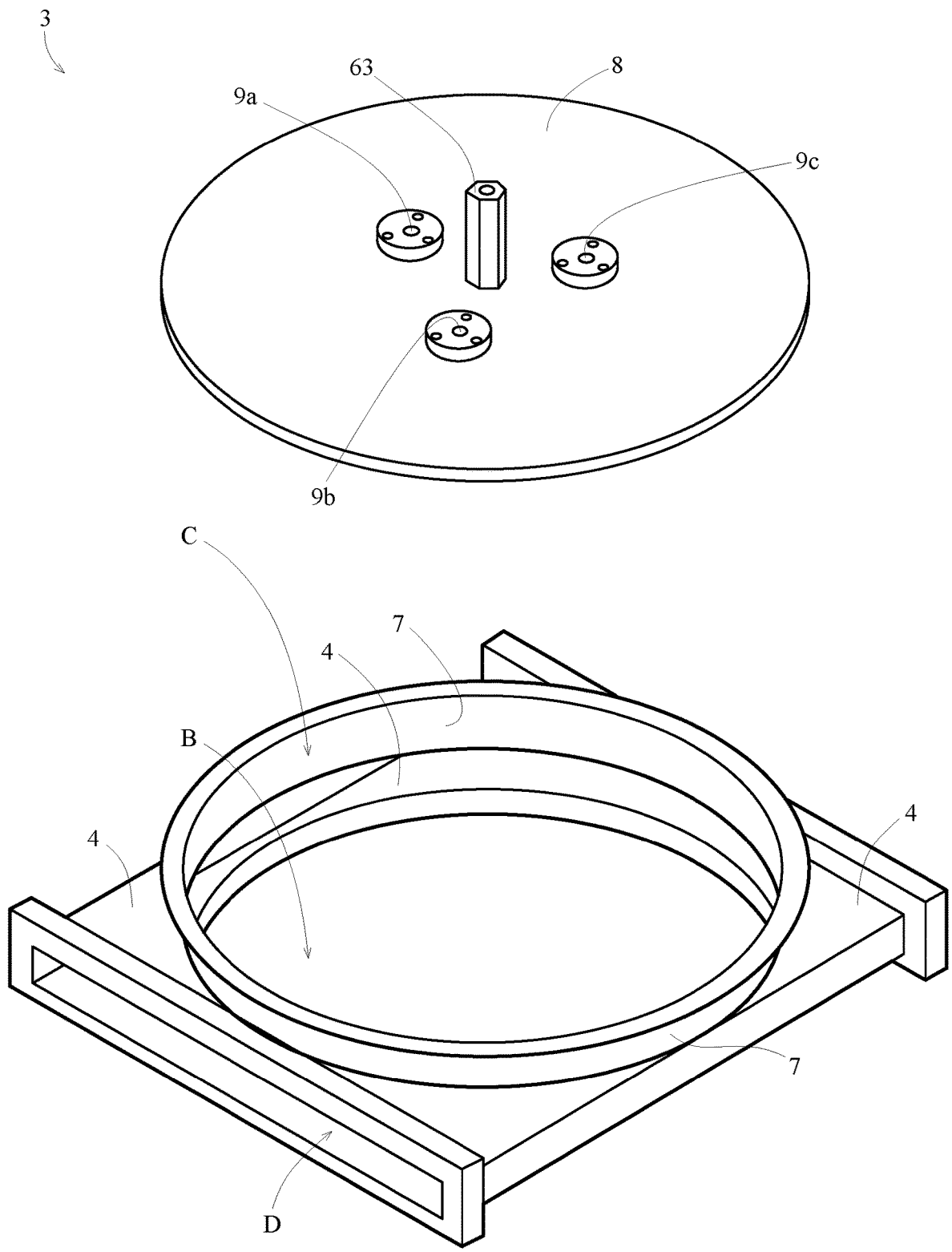
FIG. 3 partially illustrate s an exploded perspective view of a treatment container.

Reference is made to FIGS. 1 to 3. FIG. 2 is a partial exploded perspective view of the treatment container 3. FIG. 2 is a perspective view seen from the top. FIG. 3 is a partial exploded perspective view of the treatment container 3. FIG. 3 is a perspective view seen from the bottom.

The treatment container 3 includes a casing 4. The casing 4 is flat and has a substantially box shape. The casing 4 has a transportation port A (see FIG. 2). The transportation port A is formed on a front face of the casing 4. The transportation port A is an opening for loading the substrate W into the treatment container 3 and unloading the substrate W from the treatment container 3. The transportation port A is long in a transverse direction.

The treatment container 3 includes a shutter 5. The shutter 5 opens/closes the transportation port A. The shutter 5 is removably attached to a front part of the casing 4. The shutter 5 is attached to the casing 4, whereby the transportation port A is closed. The shutter 5 is separated from the casing 4, whereby the transportation port A is opened.

The casing 4 has an upper opening B (see FIG. 2). The upper opening B is formed on a top face of the casing 4. The upper opening B has a substantially circular shape, for example.

The treatment container 3 has a lid 6. The lid 6 opens/closes the upper opening B. The lid 6 is removably attached to an upper part of the casing 4. The lid 6 is attached to the casing 4, whereby the upper opening B is closed. The lid 6 is separated from the casing 4, whereby the upper opening B is opened.

The treatment container 3 includes a housing unit 7. The housing unit 7 is connected to the casing 4. Specifically, the housing unit 7 is connected to a lower surface of the casing 4. The housing unit 7 is, for example, substantially cylindrical. The interior of the housing unit 7 is opened to the interior of the casing 4. That is, the interior of the housing unit 7 is in communication with the interior of the casing 4. The housing unit 7 extends downwardly from the lower surface of the casing 4. The housing unit 7 has a lower end that is opened. The housing unit 7 has a lower opening C on its lower surface (see FIG. 3). The lower opening C is substantially circular, for example.

The treatment container 3 includes a base board 8. The base board 8 opens/closes the lower opening C. The board 8 has a substantially horizontal plate shape. The base board 8 is removably attached to the lower end of the housing unit 7. The base board 8 is attached to the housing unit 7, thereby closing the lower opening C. The base board 8 is removed from the housing unit 7, whereby the lower opening C is opened.

The substrate treating apparatus 1 includes a heating unit 11. The heating unit 11 heats the substrate W. The heating unit 11 is able to heat the substrate W at relatively higher temperatures. For instance, the heating unit 11 is able to heat the substrate W at 300° C. or higher. In addition, the heating unit 11 regulates the temperature for heating the substrate W.

The heating unit 11 is disposed within the treatment container 3. The heating unit 11 is placed on the base board 8. The heating unit 11 is disposed in the interior of the housing unit 7. The heating unit 11 is substantially discal. The heating unit 11 has an external diameter slightly smaller than an internal diameter of the housing unit 7. Accordingly, a clearance is sufficiently small between the housing unit 7 and the heating unit 11.

The heating unit 11 has a top face 11a that is substantially flat. The top face 11a of the heating unit 11 is located at the same level as an interior bottom face 4b of the casing 4 (see FIG. 1).

The heating unit 11 includes, for example, a temperature regulator and a plate (each not shown). The temperature regulator generates heat. Moreover, the temperature regulator regulates the temperature for heating the substrate W. The temperature regulator is, for example, a heater. The temperature regulator is attached to the plate. For instance, the temperature regulator is disposed on the plate or in the plate. The plate has the substrate W placed thereon. The plate transmits the heat generated by the temperature regulator to the substrate W placed thereon. The plate is made of metal, for example.

The casing 4 includes a lateral outlet D (see FIG. 3). The lateral outlet D is formed on a rear face of the casing 4. The lateral outlet D is an opening for exhausting gas within the treatment container 3. The lateral outlet D is long in a transverse direction.

The substrate treating apparatus 1 includes an exhaust duct 72. The exhaust duct 72 is in communication with the lateral outlet D. The exhaust duct 72 is removably attached to a rear part of the casing 4. The exhaust duct 72 is attached to the casing 4, thereby being brought into connection with the casing 4 in a communicated manner via the lateral outlet D. The exhaust duct 72 is separated from the casing 4, whereby the lateral outlet D is opened.

1-2. Seal Member

Reference is made to FIG. 1. The substrate treating apparatus 1 includes seal members 15A, 15B, 15C, and 15D. The seal member 15A is used for sealing the transportation port A. The seal member 15B is used for sealing the upper opening B. The seal member 15C is used for sealing the lower opening C. The seal member 15D is used for connecting the exhaust duct 72 to the lateral outlet D in an airtight manner. The following describes this in detail.

The seal member 15A is disposed between the casing 4 and the shutter 5. The seal member 15A is disposed around the transportation port A. The shutter 5 is in close contact with the casing 4 via the seal member 15A. The shutter 5 adheres to the casing 4, thereby sealing the transportation port A.

The seal member 15B is disposed between the casing 4 and the lid 6. The seal member 15B is disposed around the upper opening B. The lid 6 is in close contact with the casing 4 via the seal member 15B. The lid 6 adheres to the casing 4, thereby sealing the upper opening B.

The seal member 15C is disposed between the housing unit 7 and the base board 8. The seal member 15C is disposed around the lower opening C. The base board 8 is in close contact with the housing unit 7 via the seal member 15C. The base board 8 adheres to the housing unit 7, whereby the lower opening C is sealed.

The seal member 15D is disposed between the casing 4 and the exhaust duct 72. The seal member 15D is disposed around the lateral outlet D. The exhaust duct 72 is in close contact with the casing 4 via the seal member 15D. The exhaust duct 72 adheres to the casing 4, thereby being brought into connection with the lateral outlet D in a communicated and airtight manner.

The seal members 15A to 15D are hereunder referred to as the "seal member 15" appropriately when any distinction between them is unnecessary. The seal member 15 is annular. The seal member 15 is, for example, made of synthetic resin. The seal member 15 is, for example, an O-ring.

It is preferred that the seal member 15A is disposed in a groove (e.g., a dovetail groove) that is formed in the casing 4 or the shutter 5. This suitably prevents the seal member 15A from dropping off. It is preferred that the seal member 15B is disposed in a groove (e.g., a dovetail groove) that is formed in the casing 4 or the lid 6. This suitably prevents the seal member 15B from dropping off. It is preferred that the seal member 15C is disposed in a groove (e.g., a dovetail groove) that is formed in the housing unit 7 or the base board 8. This suitably prevents the seal member 15C from dropping off. It is preferred that the seal member 15D is disposed in a groove (e.g., a dovetail groove) that is formed in the casing 4 or the exhaust duct 72. This suitably prevents the seal member 15D from dropping off.

1-3. Cooling Unit

The substrate treating apparatus 1 includes cooling units 16A, 16B, 16C, and 16D. The cooling units 16A, 16B, 16C, and 16D cool the seal members 15A, 15B, 15C, and 15D, respectively.

The cooling unit 16A is a passageway for passing the cooling water. Hereunder, the cooling unit 16A is referred to as a "cooling channel 16A" appropriately. The cooling channel 16A is disposed adjacent to the seal member 15A. The cooling channel 16A is disposed around the transportation port A. For instance, the cooling channel 16A is formed in a wall of the casing 4. The cooling channel 16A is disposed in the front part of the casing 4. The cooling channel 16A is thermally connected to the seal member 15A via the casing 4. Here, heat of the seal member 15A is transmitted to the cooling water that flows in the cooling channel 16A. This cools the seal member 15A. That is, this prevents an excessively heightened temperature of the seal member 15A.

The cooling unit 16B is piping for passing the cooling water. Hereunder, the cooling unit 16B is referred to as a "cooling pipe 16B" appropriately. The cooling pipe 16B is disposed adjacent to the seal member 15B. The cooling pipe 16B is disposed around the upper opening B. For instance, the cooling pipe 16B is disposed adjacent to the upper part of the casing 4. The cooling pipe 16B is thermally connected to the seal member 15B via the casing 4. Here, heat of the seal member 15B is transmitted to the cooling water that flows in the cooling pipe 16B. This cools the seal member 15B.

The cooling unit 16C is piping for passing the cooling water. Hereunder, the cooling unit 16C is referred to as a "cooling pipe 16C" appropriately. The cooling pipe 16C is disposed adjacent to the seal member 15C. The cooling pipe 16C is disposed around the lower opening C. For instance, the cooling pipe 16C is disposed adjacent to the lower end of the housing unit 7. The cooling pipe 16C is, for example, thermally connected to the seal member 15C via the housing unit 7. Here, heat of the seal member 15C is transmitted to the cooling water that flows in the cooling pipe 16C. This cools the seal member 15C.

The cooling unit 16D is a passageway for passing the cooling water. Hereunder, the cooling unit 16D is referred to as a "cooling channel 16D" appropriately. The cooling channel 16D is disposed adjacent to the seal member 15D. The cooling channel 16D is disposed around the lateral outlet D. For instance, the cooling channel 16D is formed in a wall of the casing 4. The cooling channel 16D is disposed in the rear part of the casing 4. The cooling channel 16D is thermally connected to the seal member 15D via the casing 4. Here, heat of the seal member 15D is transmitted to the cooling water that flows in the cooling channel 16D. This cools the seal member 15D.

Reference is made to FIG. 2. The cooling channel 16A includes a first end 16A1 and a second end 16A2. The first end 16A1 and the second end 16A2 are each formed in the casing 4. The first end 16A1 is connected to a cooling water supplying section (not shown). The cooling water supplying section supplies the cooling water to the cooling channel 16A. The second end 16A2 is connected to a cooling water discharge section, not shown. The cooling water discharge section receives the cooling water discharged from the cooling channel 16A.

The cooling channel 16D includes a first end 16D1 and a second end 16D2. The first end 16D1 and the second end 16D2 are each formed in the casing 4. The first end 16D1 is connected to the cooling water supplying section (not shown). The cooling water supplying section supplies the cooling water to the cooling channel 16D. The second end 16D2 is connected to the cooling water discharge section, not shown. The cooling water discharge section receives the cooling water discharged from the cooling channel 16D.

1-4. Shutter Drive Mechanism

Reference is made to FIG. 1. The substrate treating apparatus 1 includes a shutter drive mechanism 21. The shutter drive mechanism 21 moves the shutter 5, thereby causing the shutter 5 to removably attach to the casing 4. The shutter drive mechanism 21 is disposed in the exterior of the treatment container 3. The shutter drive mechanism 21 includes, for example, an air cylinder.

1-5. Substrate Moving Mechanism

The substrate treating apparatus 1 includes a substrate moving mechanism 23. The substrate moving mechanism 23 moves the substrate W between a heating position PH and a cooling position PC.

FIG. 1 illustrates a substrate W in the heating position PH by solid lines. FIG. 1 illustrates a substrate W in the cooling position PC by dotted lines. The heating position PH is a position of the substrate W that contacts the heating unit 11. Specifically, the heating position PH is the position of the substrate W that is placed on the heating unit 11. When the substrate W is located at the heating position PH, a back side of the substrate W contacts the top face 11a of the heating unit 11. The cooling position PC is the position of the substrate W further away from the heating unit 11 than the heating position PH. Specifically, the cooling position PC is above the heating position PH. When the substrate W is located at the cooling position PC, the substrate W does not contact the heating unit 11. It should be noted that both the heating position PH and the cooling position PC are positions of the substrate W in the interior of the treatment container 3. The substrate W is in a substantially horizontal attitude when the substrate W is located at any of the heating position PH and the cooling position PC.

Figure 4:
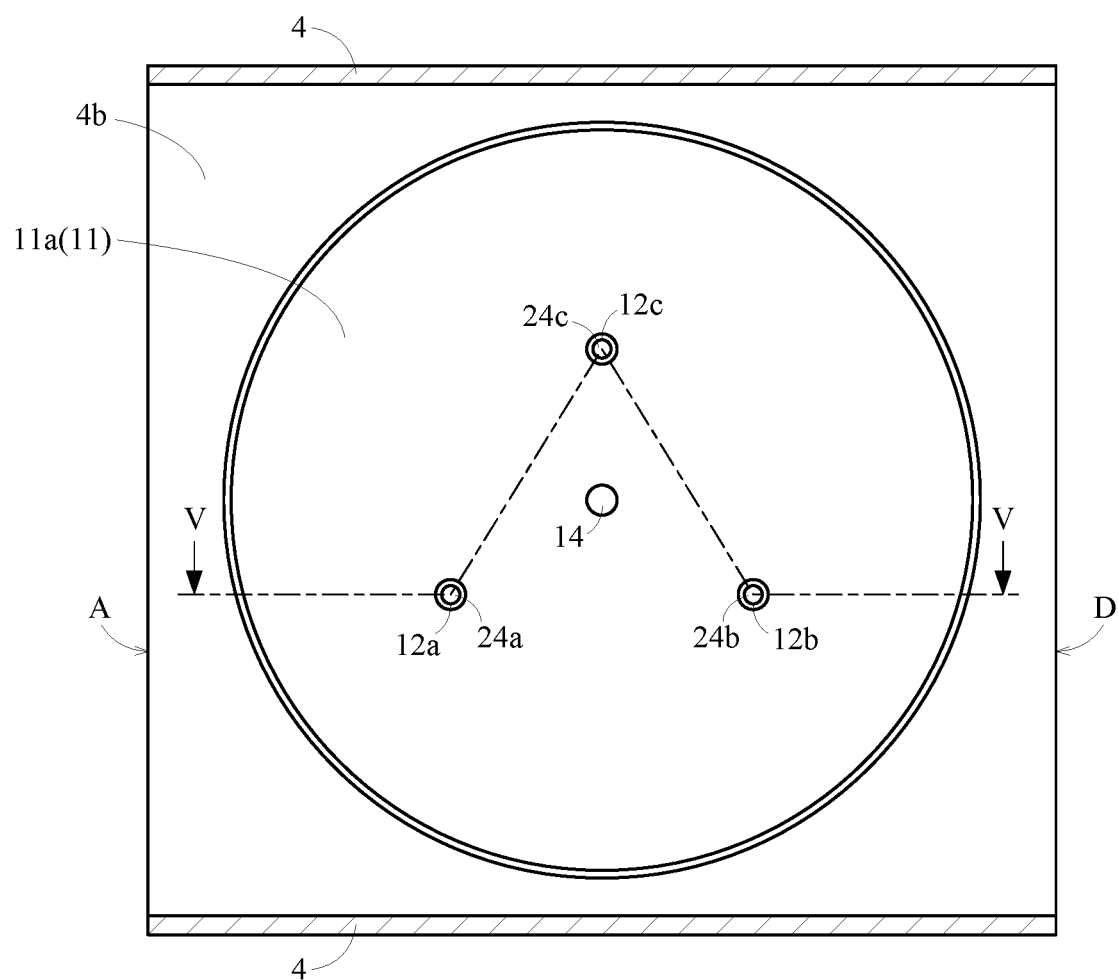
FIG. 4 is a plan view of an interior of the treatment container.

Reference is made to FIGS. 1 and 4. FIG. 4 is a plan view of the interior of the treatment container 3. The substrate moving mechanism 23 includes pins 24a, 24b, and 24c. In FIG. 1, illustration of the pin 24c is omitted. The pins 24a, 24b, and 24c contact the back side of one substrate W. This causes the pins 24a, 24b, and 24c to support the one substrate W.

The pins 24a, 24b, and 24c are referred to as a "pin 24" appropriately when any distinction between them is unnecessary. The pin 24 is an elongated rod. Specifically, the pin is cylindrical. The pin 24 extends linearly.

Figure 5:
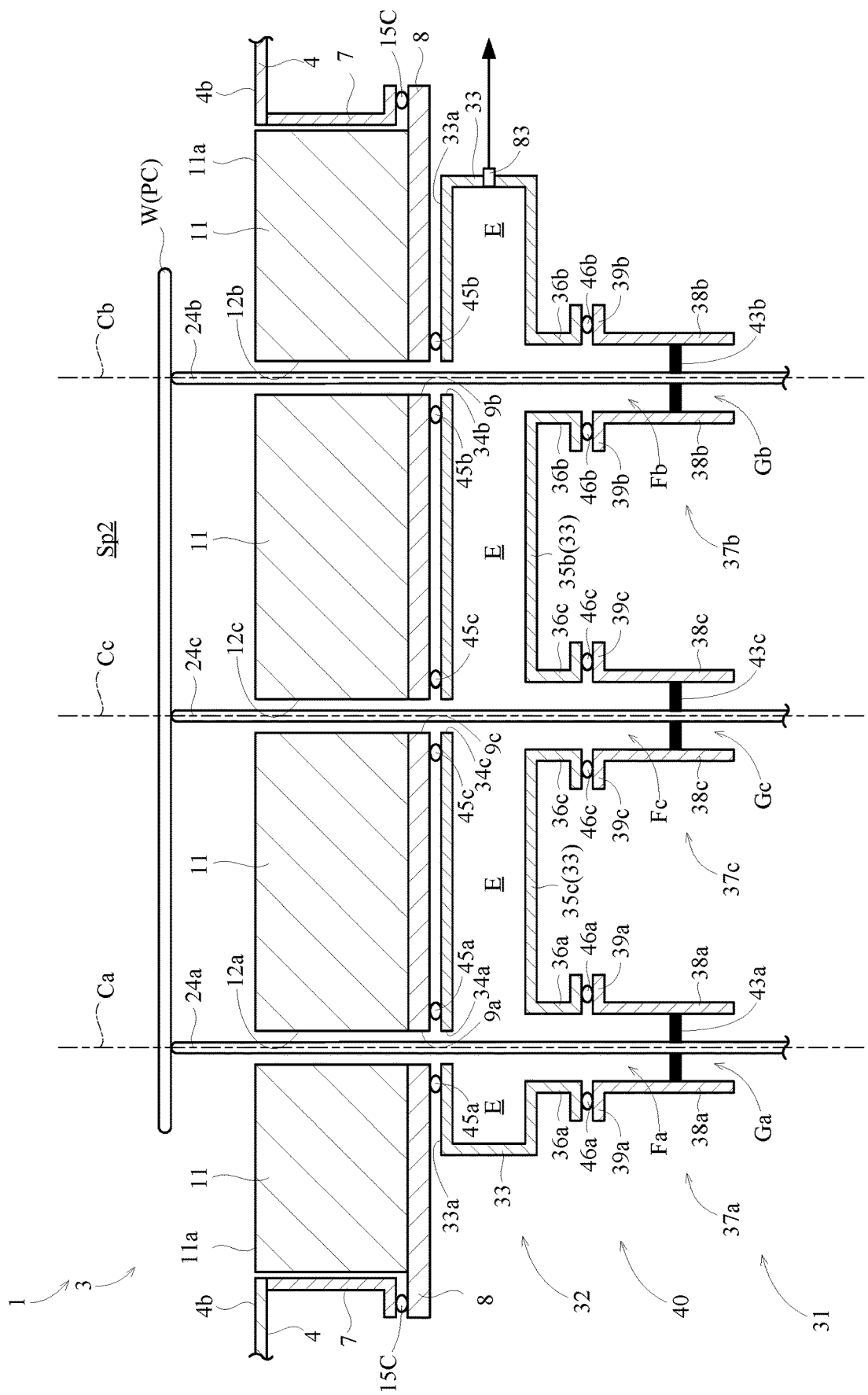
FIG. 5 is a sectional view along a V-V line of FIG. 4.

Reference is made to FIG. 5. FIG. 5 is a sectional view along a V-V line of FIG. 4. The pin 24 passes through the treatment container 3. The treatment container 3 includes openings 9a, 9b, and 9c. The openings 9a, 9b, and 9c are referred to as an "opening 9" appropriately when any distinction between them is unnecessary. The opening 9 is formed in the base board 8. The pin 24a is disposed in the opening 9a. The pin 24b is disposed in the opening 9b. The pin 24c is disposed in the opening 9c. The pin 24 is disposed between the interior and the exterior of the treatment container 3 through the opening 9. The pin 24 includes a distal end located in the interior of the treatment container 3. The pin 24 includes a proximal end located in the exterior of the treatment container 3. The proximal end of the pin 24 is located below the treatment container 3 (see FIG. 1).

The pin 24 is disposed so as to extend in a substantially vertical direction. The pins 24a, 24b, and 24c have axes Ca, Cb, and Cc, respectively, that are parallel to one another. The axes Ca, Cb, and Cc are referred to as an "axis C" appropriately when any distinction between them is unnecessary. The axis C of the pin 24 is parallel to the substantially vertical direction.

A clearance is formed between the opening 9 and the pin 24 disposed in the opening 9. Specifically, clearances are formed between the opening 9a and the pin 24a, between the opening 9b and the pin 24b, and between the opening 9c and the pin 24c, respectively. The clearance is defined by an inner peripheral surface of the opening 9 and an outer peripheral surface of the pin 24. The clearance is annular.

The pin 24 passes through the heating unit 11. The heating unit 11 includes pin hole 12a, 12b, and 12c. The pin holes 12a, 12b, and 12c are referred to as a "pin hole 12" when any distinction between them is unnecessary. The pin hole 12 is formed in the heating unit 11. The pin hole 12 is formed from a lower surface to a top face 11a of the heating unit 11. The pin hole 12a, 12b, and 12c are in communication with the openings 9a, 9b, and 9c, respectively. The pin hole 12 is opened toward the above of the heating unit 11. The pin 24a is disposed in the pin hole 12a. The pin 24b is disposed in the pin hole 12b. The pin 24c is disposed in the pin hole 12c.

A clearance is formed between the pin hole 12 and the pin 24 disposed in the pin hole 12. The clearance is defined by an inner peripheral surface of the pin hole 12 and the outer peripheral surface of the pin 24. The clearance is annular. The clearance between the pin hole 12 and the pin 24 is in communication with the clearance between the opening 9 and the pin 24.

One of the openings 9a, 9b, and 9c is one example of the first opening in the present invention. Another one of the openings 9a, 9b, and 9c is one example of the second opening in the present invention. The pin hole 12 is one example of the through hole in the present invention. One of the pins 24a, 24b, and 24c is one example of the first shaft member in the present invention. Another one of the pins 24a, 24b, and 24c is one example of the second shaft member in the present invention.

Reference is made to FIG. 1. The substrate moving mechanism 23 includes a pin drive mechanism 25. The pin drive mechanism 25 is disposed in the exterior of the treatment container 3. The pin drive mechanism 25 is connected to the proximal end of the pin 24. The pin drive mechanism 25 moves the pin 24 upwardly/downwardly. The pin drive mechanism 25 includes an air cylinder, for example.

The pin drive mechanism 25 causes the pin 24 to reciprocate along the axis C of the pin 24. The pin 24 moves between an upper position and a lower position thereof.

When the pin 24 is located at the upper position, the distal end of the pin 24 is positioned higher than a top face 11a of the heating unit 11. When the pin 24 is located at the upper position, the distal end of the pin 24 contacts the back side of the substrate W. When the pin 24 is located at the upper position, the pin 24 supports the substrate W at the cooling position PC.

When the pin 24 is located at the lower position, the distal end of the pin 24 is in a position equal to or lower than the top face 11a of the heating unit 11 in level. When the pin 24 is located at the lower position, the distal end of the pin 24 may or may not contact the substrate W. When the pin 24 is located at the lower position, the substrate W is positioned at the heating position PH.

The pin 24 moves between the upper position and the lower position, whereby the substrate W moves between the cooling position PC and the heating position PH.

1-6. Sealing Mechanism

The substrate treating apparatus 1 includes a sealing mechanism 31. The sealing mechanism 31 seals the opening 9 while allowing reciprocation of the pin 24. Strictly speaking, the sealing mechanism 31 seals the clearance between the opening 9a and the pin 24a, the clearance between the opening 9b and the pin 24b, and the clearance between the opening 9c and the pin 24c.

The sealing mechanism 31 is disposed in the exterior of the treatment container 3. The sealing mechanism 31 is disposed below the treatment container 3. The sealing mechanism 31 is disposed higher than the proximal end of the pin 24.

Figure 6:
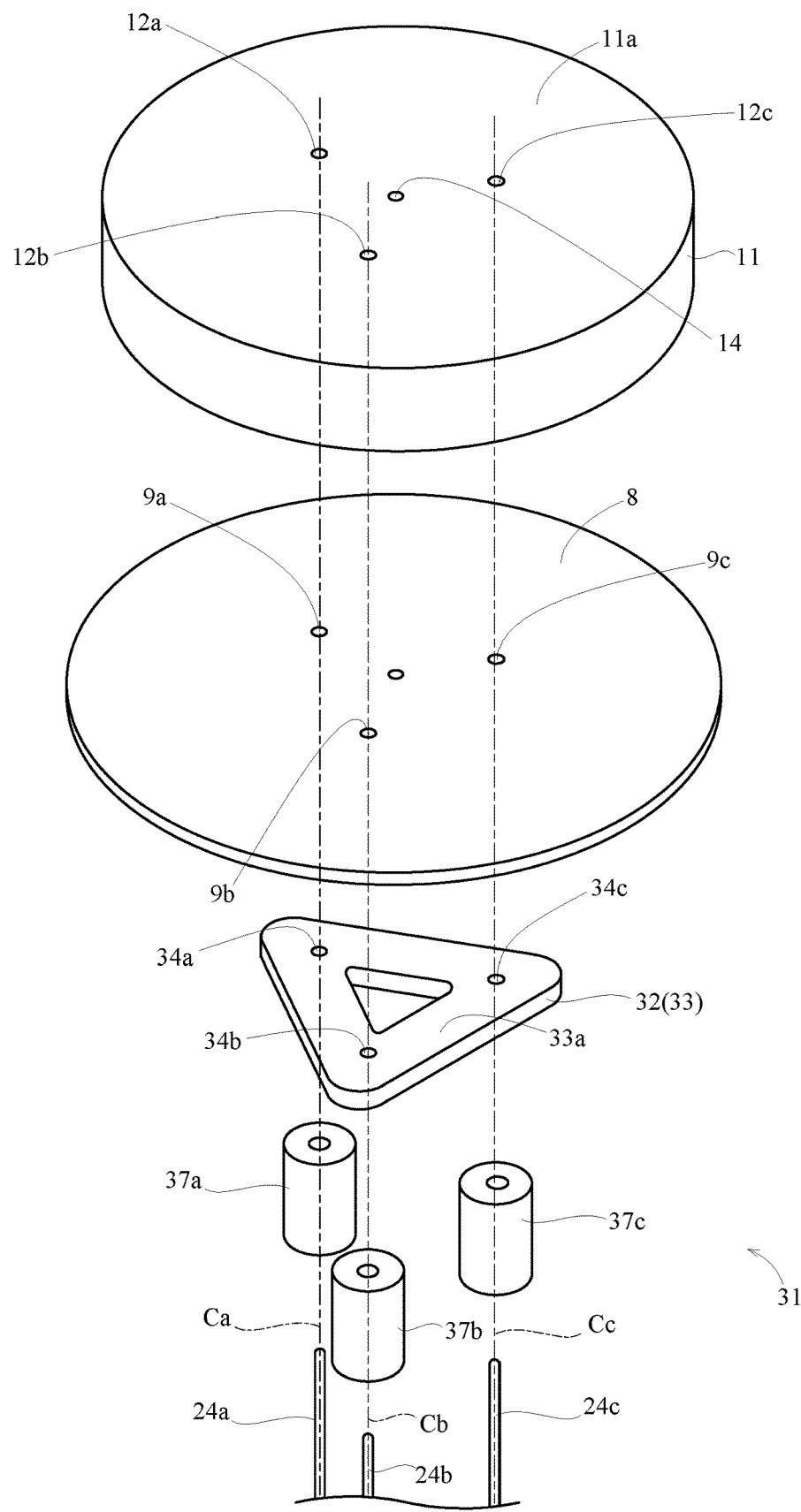
FIG. 6 is an exploded perspective view of a heating unit, a base board, a sealing mechanism, and pins.

Reference is made to FIG. 6. FIG. 6 illustrates an exploded perspective view of the heating unit 11, the base board 8, the sealing mechanism 31, and the pin 24. The heating unit 11 is placed on the top face of the base board 8. The sealing mechanism 31 is connected to the lower surface of the base board 8. The pin 24 passes through the sealing mechanism 31, the base board 8, and the heating unit 11.

The sealing mechanism 31 includes a manifold 32 and shaft sealing parts 37a, 37b, and 37c. The shaft sealing parts 37a, 37b, and 37c are referred to as a "shaft sealing part 37" when any distinction between them is unnecessary. The manifold 32 is connected to the base board 8. The shaft sealing part 37 is connected to the manifold 32.

The manifold 32 is removable from the base board 8. The shaft sealing part 37 is removable from the manifold 32. The manifold 32 and the shaft sealing part 37 are each made of metal.

Figure 7:
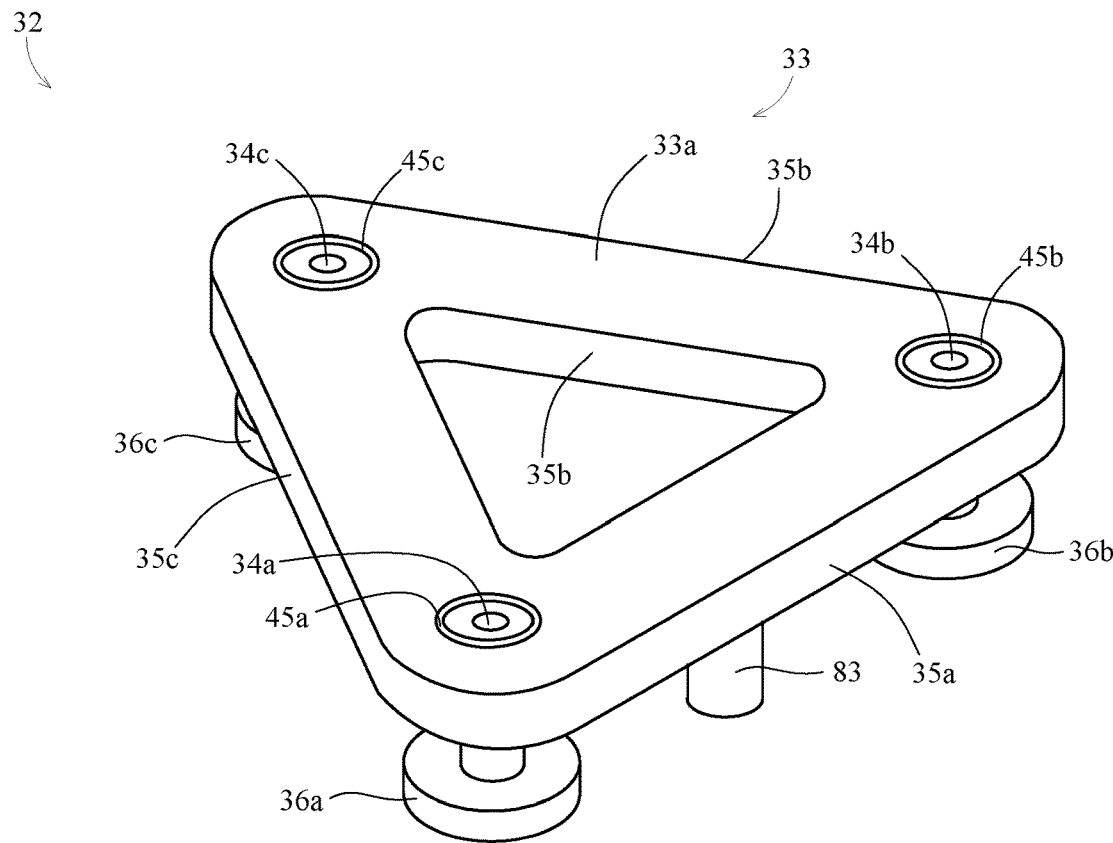
FIG. 7 is a perspective view of a manifold.

FIG. 7 is a perspective view of the manifold 32. The manifold 32 includes an aggregated part or collector 33. The aggregated part 33 has a substantially annular shape in plan view. More specifically, the aggregated part 33 has a substantially triangular annular shape in plan view.

The aggregated part 33 includes openings 34a, 34b, and 34c. The openings 34a, 34b, and 34c are referred to as an "opening 34" when any distinction between them is unnecessary. The opening 34 is formed on a top face 33a of the aggregated part 33. The top face 33a of the aggregated part 33 is substantially planar. The openings 34a, 34b, and 34c are disposed at the same positions as the opening 9a, 9b, and 9c, respectively, in plan view. The pin 24a is located in the opening 34a. The pin 24b is located in the opening 34b. The pin 24c is located in the opening 34c.

Reference is made to FIG. 5. The aggregated part 33 includes one space E inside thereof. The space E is in communication with the opening 34.

Reference is made to FIG. 7. The aggregated part 33 includes pipes 35a, 35b, and 35c. The pipes 35a, 35b, and 35c are in connection with one another in a ring shape in a communicated manner. The pipes 35a, 35b, and 35c are referred to as a "pipe 35" when any distinction between them is unnecessary. The pipe 35 extends linearly. The pipe 35 is, for example, a square tube.

The pipe 35a extends between the openings 34a and 34b. That is, the pipe 35a extends between the pins 24a and 24b. Likewise, the pipe 35b extends between the openings 34b and 34c. That is, the pipe 35b extends between the pins 24b and 24c. The pipe 35c extends between the openings 34c and 34a. That is, the pipe 35c extends between the pins 24c and 24a. The pipe 35 extends substantially horizontally. That is, the pipe 35 extends in a direction substantially orthogonal to the axis C of the pin 24.

The manifold 32 includes joints 36a, 36b, and 36c. The joint 36a, 36b, and 36c join the shaft sealing parts 37a, 37b, and 37c, respectively. The joints 36a, 36b, and 36c are referred to as a "joint 36" when any distinction between them is unnecessary. The joint 36 has a flange shape, for example. The joint 36 is in connection with the aggregated part 33 in a communicated manner. The joint 36 is connected to a lower surface of the aggregated part 33. The joint 36 extends downwardly from the aggregated part 33.

Reference is made to FIG. 5. The shaft sealing part 37a includes one cylinder 38a, one joint 39a, and one seal member 43a. The shaft sealing part 37b includes one cylinder 38b, one joint 39b, and one seal member 43b. The shaft sealing part 37c includes one cylinder 38c, one joint 39c, and one seal member 43c.

The cylinders 38a, 38b, and 38c are referred to as a "cylinder 38" when any distinction between them is unnecessary. The cylinder 38 is substantially cylindrical. The cylinder 38 includes a first opening formed at one end of the cylinder 38 and a second opening formed at the other end of the cylinder 38.

The joints 39a, 39b, and 39c are referred to as a "joint 39" when any distinction between them is unnecessary. The joint 39 is connected to an upper end of the cylinder 38. The joint 39 has a flange shape, for example.

The seal members 43a, 43b, and 43c are referred to as a "seal member 43" when any distinction between them is unnecessary. The seal member 43 is made of metal. The seal member 43 has a circular ring shape. The seal member 43 is in close contact with an inner peripheral surface of the cylinder 38. Specifically, an outer periphery edge of the seal member 43 contacts the inner peripheral surface of the cylinder 38 in an airtight manner. The seal member 43 has an opening at the center thereof. The pin 24a is disposed in the opening of the seal member 43a. The pin 24b is disposed in the opening of the seal member 43b. The pin 24c is disposed in the opening of the seal member 43c.

The seal member 43 is in close contact with the outer peripheral surface of the pin 24 so as to slide relative to the pin 24. Specifically, an inner peripheral edge of the seal member 43 contacts the outer peripheral surface of the pin 24 in an airtight manner. The outer peripheral surface of the pin 24 is slidable relative to the seal member 43. When reciprocating in the direction of the axis C, the pin 24 slides relative to the seal member 43. Even when the pin 24 slides relative to the seal member 43, the seal member 43 continuously adheres to the pin 24. In other words, the pin 24 is movable relative to the seal member 43 in the state where the pin 24 adhers to the seal member 43.

As noted above, the seal members 43a, 43b, and 43c seal the pins 24a, 24b, and 24c, respectively. Consequently, the seal member 43a divides the interior of the shaft sealing part 37a into spaces Fa and Ga. The space Fa is above the seal member 43a. The space Ga is below the seal member 43a. The space Fa and the space Ga are not in communication with each other. Likewise, the seal member 43b divides the interior of the shaft sealing part 37b into spaces Fb and Gb. The space Fb and the space Gb are not in communication with each other. The seal member 43c divides the interior of the shaft sealing part 37c into spaces Fc and Gc. The space Fc and the space Gc are not in communication with each other.

The spaces Ga, Gb, and Gc are opened to the exterior of the treatment container 3 and the sealing mechanism 31. The spaces Ga, Gb, and Gc each contain outside air. The spaces Fa, Fb, and Fc are each isolated from outside air.

The sealing mechanism 31 includes seal member 45a, 45b, and 45c. The seal member 45a, 45b, and 45c are used so as for the treatment container 3 to be brought into close contact with the manifold 32. Specifically, the seal members 45a, 45b, and 45c are used so as for the lower surface of the base board 8 to adhere to the top face 33a of the aggregated part 33.

The seal members 45a, 45b, and 45c are referred to as a "seal member 45" when any distinction between them is unnecessary. The seal member 45 is annular. The seal member 45 is made of synthetic resin, for example. The seal member 45 is, for example, an O-ring.

The seal member 45 is disposed between the lower surface of the base board 8 and the top face 33a of the aggregated part 33. The seal member 45a is disposed around the opening 9a. The seal member 45b is disposed around the opening 9b. The seal member 45c is disposed around the opening 9c. The aggregated part 33 is in close contact with the base board 8 via the seal member 45a, 45b, and 45c. The aggregated part 33 adheres to the base board 8 around the openings 9a, 9b, and 9c. More specifically, the aggregated part 33 adheres to regions of the base board 8 around the openings 9a, 9b, and 9c, respectively.

It is preferred that the seal member 45 is disposed in a groove (e.g., a dovetail groove) that is formed in the base board 8 or the aggregated part 33. This suitably prevents the seal member 45 from dropping off.

The aggregated part 33 adheres to the base board 8, whereby the openings 9a, 9b, 9c are in communication with the openings 34a, 34b, and 34c, respectively. Accordingly, the opening 9 is in communication with the interior of the aggregated part 33 (i.e., the space E). The pin hole 12 is in communication with the space E via the opening 9. In other words, the interior of the treatment container 3 is in communication with the space E.

The sealing mechanism 31 includes seal members 46a, 46b, and 46c. The seal member 46a is used so as for the manifold 32 to be brought into close contact with the shaft sealing part 37a. The seal member 46b is used so as for the manifold 32 to be brought into close contact with the shaft sealing part 37b. The seal member 46c is used so as for the manifold 32 to be brought into close contact with the shaft sealing part 37c.

The seal members 46a, 46b, and 46c are referred to as the "seal member 46" when any distinction between them is unnecessary. The seal member 46 is annular. The seal member 46 is, for example, made of synthetic resin. The seal member 46 is, for example, an O-ring.

The seal member 46a is disposed between the joints 36a and 39a. The joint 36a is in close contact with the joint 39a via the seal member 46a. This causes the cylinder 38a to be in connection with the aggregated part 33 in a communicated manner. The seal member 46b is disposed between the joints 36 and 39b. The joint 36b is in close contact within the joint 39b via the seal member 46b. This causes the cylinder 38b to be in connection with the aggregated part 33 in a communicated manner. The seal member 46c is disposed between the joints 36c and 39c. The joint 36c is in close contact with the joint 39c via the seal member 46c. This causes the cylinder 38c to be in connection with the aggregated part 33 in a communicated manner. As a result, the space E is in communication with the spaces Fa, Fb, and Fc.

It is preferred that the seal member 46 is disposed in a groove (e.g., a dovetail groove) that is formed in the joints 36 or 39. This suitably prevents the seal member 46 from dropping off.

Here, the entire of the manifold 32 and a part of the shaft sealing part 37 (i.e., the cylinder 38 and the joint 39) are referred to as a "seal housing 40". The spaces E, Fa, Fb, and Fc entirely correspond to the interior of the seal housing 40. The seal housing 40 is in close contact with the treatment container 3 around the opening 9, and accommodates a part of the pin 24.

Strictly speaking, the aggregated part 33, the joint 36, the cylinder 38a, and the joint 39a accommodate a part of the pin 24a. The aggregated part 33, the joint 36b, the cylinder 38b, and the joint 39b accommodate a part of the pin 24b. The aggregated part 33, the joint 36c, the cylinder 38c, and the joint 39c accommodate a part of the pin 24c.

As mentioned above, the opening 9 is in communication with the space E. The space E is in communication with the spaces Fa, Fb, and Fc. The spaces Fa, Fb, and Fc are isolated from outside air. Accordingly, the space E and the opening 9 are isolated from outside air. In other words, the opening 9 is sealed.

One of the pipes 35a, 35b, and 35c is one example of the first pipe in the present invention. One of the cylinders 38a, 38b, and 38c is one example of the first cylinder in the present invention. Another one of the cylinders 38a, 38b, and 38c is one example of the second cylinder in the present invention. The seal housing 40 is one example of the first seal housing in the present invention. One of the seal members 43a, 43b, and 43c is one example of the first seal member in the present invention. Another one of the seal members 43a, 43b, and 43c is one example of the second seal member in the present invention.

1-7. Cooling of Sealing Mechanism 31

Reference is made to FIG. 1. The substrate treating apparatus 1 includes a cooling unit 47. The cooling unit 47 is a pipe for passing cooling water. Hereunder, the cooling unit 47 is referred to as a "cooling pipe 47" appropriately. The cooling pipe 47 includes a cooling channel into which the cooling water flows. The cooling channel is formed in an interior of the cooling pipe 47.

The cooling pipe 47 is disposed adjacent to the sealing mechanism 31. The cooling pipe 47 is disposed laterally of the sealing mechanism 31. The cooling pipe 47 surrounds the sealing mechanism 31.

The cooling pipe 47 is disposed adjacent to the seal housing 40. The cooling pipe 47 is disposed laterally of the seal housing 40. The cooling pipe 47 surrounds the seal housing 40.

Figure 8:
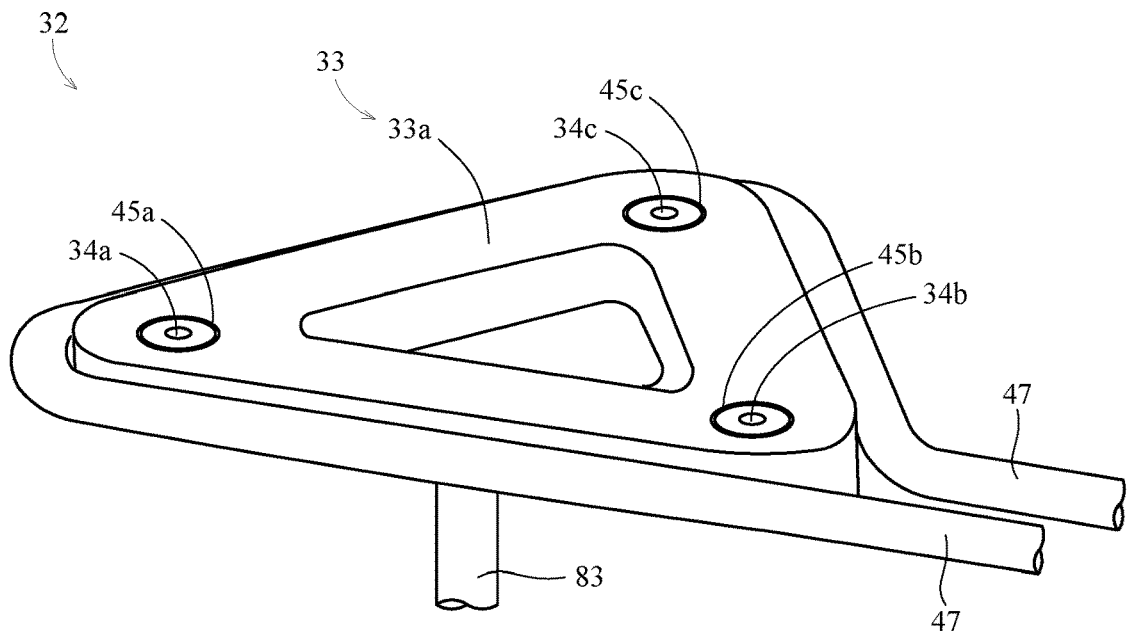
FIG. 8 is a perspective view of the manifold and a cooling unit.

FIG. 8 is a perspective view of the manifold 32 and the cooling unit 47. The cooling pipe 47 is disposed adjacent to the aggregated part 33. The cooling pipe 47 is disposed laterally of the aggregated part 33. The cooling pipe 47 surrounds the aggregated part 33. The cooling pipe 47 is disposed adjacent to the pipe 35. The cooling pipe 47 is disposed along the pipe 35.

Heat of the sealing mechanism 31 is transmitted to the cooling water within the cooling pipe 47. In other words, the cooling pipe 47 cools the sealing mechanism 31. The sealing mechanism 31 is in close contact with the pin 24. Accordingly, heat of the pin 24 is transmitted to the cooling water within the cooling pipe 47 via the sealing mechanism 31. In other words, the cooling pipe 47 also cools the pin 24.

The cooling unit 47 is one example of the cooling unit in the present invention.

1-8. Upper Supplying Section 51

Reference is made to FIG. 1. The substrate treating apparatus 1 includes an upper supplying section 51. The upper supplying section 51 supplies non-oxidizing gas into the treatment container 3. The upper supplying section 51 blows the non-oxidizing gas from a position higher than the cooling position PC. The non-oxidizing gas is, for example, inert gas. Examples of the inert gas include nitrogen gas and argon gas.

The upper supplying section 51 includes a pipe 52, a supply port 53, an on-off valve 54, and a flow amount adjusting unit 55. The pipe 52 has a first end connected to a non-oxidizing gas supplying source 69. The non-oxidizing gas supplying source 69 supplies non-oxidizing gas. The pipe 52 has a second end connected to the supply port 53. The supply port 53 is attached to the lid 6. The supply port 53 is in communication with the interior of the treatment container 3. The on-off valve 54 and the flow amount adjusting unit 55 are disposed on the pipe 52. The on-off valve 54 opens/closes a flow path of the pipe 52. The flow amount adjusting unit 55 adjusts a flow amount of the non-oxidizing gas flowing in the pipe 52. The flow amount adjusting unit 55 includes at least either a needle valve or a mass flow meter, for example.

The upper supplying section 51 includes a straightening vane 56. The straightening vane 56 is disposed in the interior of the treatment container 3. The straightening vane 56 is disposed on the opening B. The straightening vane 56 is disposed below the lid 6. The straightening vane 56 is disposed above the cooling position PC. The straightening vane 56 is a substantially horizontal plate. The straightening vane 56 includes a plurality of fine holes 56a. The fine hole 56a pass the straightening vane 36 vertically. The fine holes 56a is one example of the upper supply port in the present invention.

Here, a space defined by the lid 6 and the straightening vane 56 is referred to as an "introducing chamber Sp1". In addition, a space defined by the casing 4, the shutter 5, the straightening vane 56, and the heating unit 11 is referred to as a "treatment chamber Sp2". The introducing chamber Sp1 is above the straightening vane 56. The treatment chamber Sp2 is below the straightening vane 56. The introducing chamber Sp1 and the treatment chamber Sp2 are in communication with each other via the fine holes 56a. It should be noted that both the introducing chamber Sp1 and the treatment chamber Sp2 are spaces within the treatment container 3. The introducing chamber Sp1 and the treatment chamber Sp2 are a part of the interior of the treatment container 3.

The on-off valve 54 opens, whereby the non-oxidizing gas flows from the non-oxidizing gas supplying source 69 into the introducing chamber Sp1 through the pipe 52 and the supply port 53. In addition, the non-oxidizing gas flows from the introducing chamber Sp1 into the treatment chamber S2 through the fine holes 56a of the straightening vane 56. The fine holes 56a blow the non-oxidizing gas downwardly. The flow amount adjusting unit 55 adjusts a supply amount of the non-oxidizing gas supplied to the treatment container 3 through the supply port 53. The on-off valve 54 closes, whereby the upper supplying section 51 stops supply of the non-oxidizing gas. Closure of the on-off valve 54 causes the supply port 53 to be sealed.

1-9. Lower Supplying Section 61

The substrate treating apparatus 1 includes a lower supplying section 61. The lower supplying section 61 supplies non-oxidizing gas into the treatment container 3. The lower supplying section 61 blows the non-oxidizing gas from a position lower than the cooling position PC.

The lower supplying section 61 includes a pipe 62, a port 63, an on-off valve 64, and a flow amount adjusting unit 65. The pipe 62 has a first end connected to the non-oxidizing gas supplying source 69. The pipe 62 has a second end connected to the port 63. The port 63 is attached to the base board 8. The port 63 is in communication with the interior of the treatment container 3. The on-off valve 64 and the flow amount adjusting unit 65 are disposed on the pipe 62. The on-off valve 64 opens/closes the flow path in the pipe 62. The flow amount adjusting unit 65 adjusts a flow amount of the non-oxidizing gas flowing in the pipe 62. The flow amount adjusting unit 65 includes at least either a needle valve or a mass flow meter, for example.

The port 63 is in communication with a gas flow hole 14. The gas flow hole 14 is a through hole formed in the heating unit 11. The gas flow hole 14 reaches the top face 11a of the heating unit 11. The gas flow hole 14 is opened toward the above of the heating unit 11.

The on-off valve 64 opens, whereby the non-oxidizing gas flows from the non-oxidizing gas supplying source 69 into the treatment container 3 through the pipe 62 and the port 63. In addition, the non-oxidizing gas flows into the treatment chamber Sp2 through the gas flow hole 14. The gas flow hole 14 blows the non-oxidizing gas upwardly. The flow amount adjusting unit 65 adjusts a supply amount of the non-oxidizing gas supplied to the treatment container 3 through the port 63. The on-off valve 64 closes, whereby the lower supplying section 61 stops supply of the non-oxidizing gas. Closure of the on-off valve 64 causes the port 63 to be sealed.

1-10. Lateral Exhaust Section 71

The substrate treating apparatus 1 includes a lateral exhaust section 71. The lateral exhaust section 71 exhausts gas in the interior of the treatment container 3 to the exterior of the treatment container 3. The lateral exhaust section 71 exhausts gas through a position laterally of the cooling position PC.

The lateral exhaust section 71 includes the exhaust duct 72 mentioned above. The exhaust duct 72 is in airtight communication with the lateral outlet D. The lateral exhaust section 71 further includes an exhaust pipe 73, an on-off valve 74, and an exhaust mechanism 75. The exhaust pipe 73 has a first end that is in connection with the exhaust duct 72 in a communicated manner. The on-off valve 74 is disposed on the exhaust pipe 73. The exhaust pipe 73 has a second end that is in connection with the exhaust mechanism 75 in a communicated manner. The exhaust mechanism 75 sucks and exhausts gas. The exhaust mechanism 75 allows adjustment of an exhaust amount of the gas. More specifically, the exhaust mechanism 75 allows the adjustment of the exhaust amount of gas by controlling a flow amount of gas or a suction pressure of gas. The exhaust mechanism 75 is, for example, a vacuum pump, an exhaust blower, or an ejector.

The on-off valve 74 is opened and the exhaust mechanism 75 is driven, whereby the gas in the interior of the treatment container 3 is exhausted through the lateral outlet D to the exterior of the treatment container 3. This achieves smooth exhaust of the gas within the treatment chamber Sp2. Moreover, the exhaust mechanism 75 adjusts the exhaust amount of the gas exhausted from the treatment container 3 through the lateral outlet D. The drive of the exhaust mechanism 75 stops, whereby the lateral exhaust section 71 stops exhaust of the gas. Closure of the on-off valve 74 causes the lateral outlet D to be sealed.

1-11. Lower Exhaust Section 81

The substrate treating apparatus 1 includes a lower exhaust section 81. The lower exhaust section 81 exhausts gas within the seal housing 40. The lower exhaust section 81 also exhausts gas within the treatment container 3 via the seal housing 40. The lower exhaust section 81 exhausts the gas from the treatment container 3 through a position lower than the cooling position PC.

The lower exhaust section 81 includes a pipe 82, an exhaust port 83, an on-off valve 84, and an exhaust mechanism 85. The pipe 82 has a first end connected to the exhaust port 83.

Reference is made to FIGS. 1 and 7. The exhaust port 83 is in connection with the seal housing 40 in a communicated manner. Specifically, the exhaust port 83 is in connection with the aggregated part 33 in a communicated manner. More specifically, the exhaust port 83 is in connection with the pipe 35a in a communicated manner.

Reference is made to FIG. 5. The exhaust port 83 is in communication with the interior of the seal housing 40 (i.e., the spaces E, Fa, Fb and Fc). The exhaust port 83 is also in communication with the opening 9 and the pin hole 12. That is, the exhaust port 83 is in communication with the interior of the treatment container 3. It should be noted that the position of the exhaust port 83 in the FIG. 5 differs from that of the exhaust port 83 in the drawings other than FIG. 5 for convenience of illustration.

Reference is made to FIG. 1. The on-off valve 84 is disposed on the pipe 82. The on-off valve 84 opens/closes a flow path in the pipe 82. The exhaust mechanism 85 is in connection with a second end of the pipe 82 in a communicated manner. The exhaust mechanism 85 sucks and exhausts gas. The exhaust mechanism 85 allows adjustment of an exhaust amount of gas. More specifically, the exhaust mechanism 85 allows the adjustment of an exhaust amount of the gas by controlling a flow amount of gas or a suction pressure of gas. The exhaust mechanism 85 is, for example, a vacuum pump, an exhaust blower, or an ejector.

The on-off valve 84 is opened and the exhaust mechanism 85 is driven, whereby the gas within the seal housing 40 and the gas within the treatment container 3 are exhausted. Specifically, the gas within the spaces Fa, Fb, and Fc flows into the space E. The gas within the treatment container 3 flows into the space E through the pin hole 12 and the opening 9. The gas within the space E flows into the pipe 82 through the exhaust port 83. This causes the gas within the seal housing 40 and the gas within the treatment container 3 to be exhausted to the exterior of the seal housing 40 and the treatment container 3. The exhaust mechanism 85 adjusts the exhaust amount of the gas exhausted from the seal housing 40 and the treatment container 3 through the exhaust port 83. Stopping drive of the exhaust mechanism 85 causes the lower exhaust section 81 to stop exhaust of gas. Closure of the on-off valve 84 causes the exhaust port 83 to be sealed.

The exhaust port 83 is one example of the first exhaust port in the present invention.

1-12. Sensor 91, 93

The substrate treating apparatus 1 includes a pressure sensor 91, and an oxygen concentration sensor 93. The pressure sensor 91 detects pressure of the gas within the treatment container 3. The oxygen concentration sensor 93 detects an oxygen concentration within the treatment container 3. The oxygen concentration sensor 93 is, for example, a galvanic cell type oxygen sensor or a zirconia type oxygen sensor.

1-13. Controller 95

The substrate treating apparatus 1 includes a controller 95. The controller 95 is connected to the heating unit 11, the shutter drive mechanism 21, the pin drive mechanism 25, the on-off valves 54, 64, 74, and 84, the flow amount adjusting unit 55 and 65, the exhaust mechanisms 75 and 85, the pressure sensor 91, and the oxygen concentration sensor 93 in a communicative manner. The controller 95 receives detection results of the pressure sensor 91 and detection results of the oxygen concentration sensor 93. The controller 95 controls the heating unit 11, the shutter drive mechanism 21, the pin drive mechanism 25, the on-off valves 54, 64, 74, 84, the flow amount adjusting units 55, 65, and the exhaust mechanisms 75, 85. The controller 95 is embodied with a central processing unit (CPU) that executes various processes, and a storage medium such as a RAM (Random-Access Memory) for a work area upon arithmetic processing and a fixed disk. The storage medium stores various types of information such as processing recipes (processing programs) for processing the substrate W and a reference value of the oxygen concentration.

2. Operation

The following describes one operational example of the substrate treating apparatus 1 according to the embodiment. In this operation example, the substrate treating apparatus 1 performs a heat treatment of the substrate W having a directed self-assembly material applied thereto. The substrate treating apparatus 1 heats the substrate W, whereby the directed self-assembly material is phase-separated. The phase-separated directed self-assembly material has a structure with high regularity. Thereafter, the substrate treating apparatus 1 cools the substrate W, whereby the structure of the phase-separated directed self-assembly material is protected from degradation or collapse.

Figure 9:
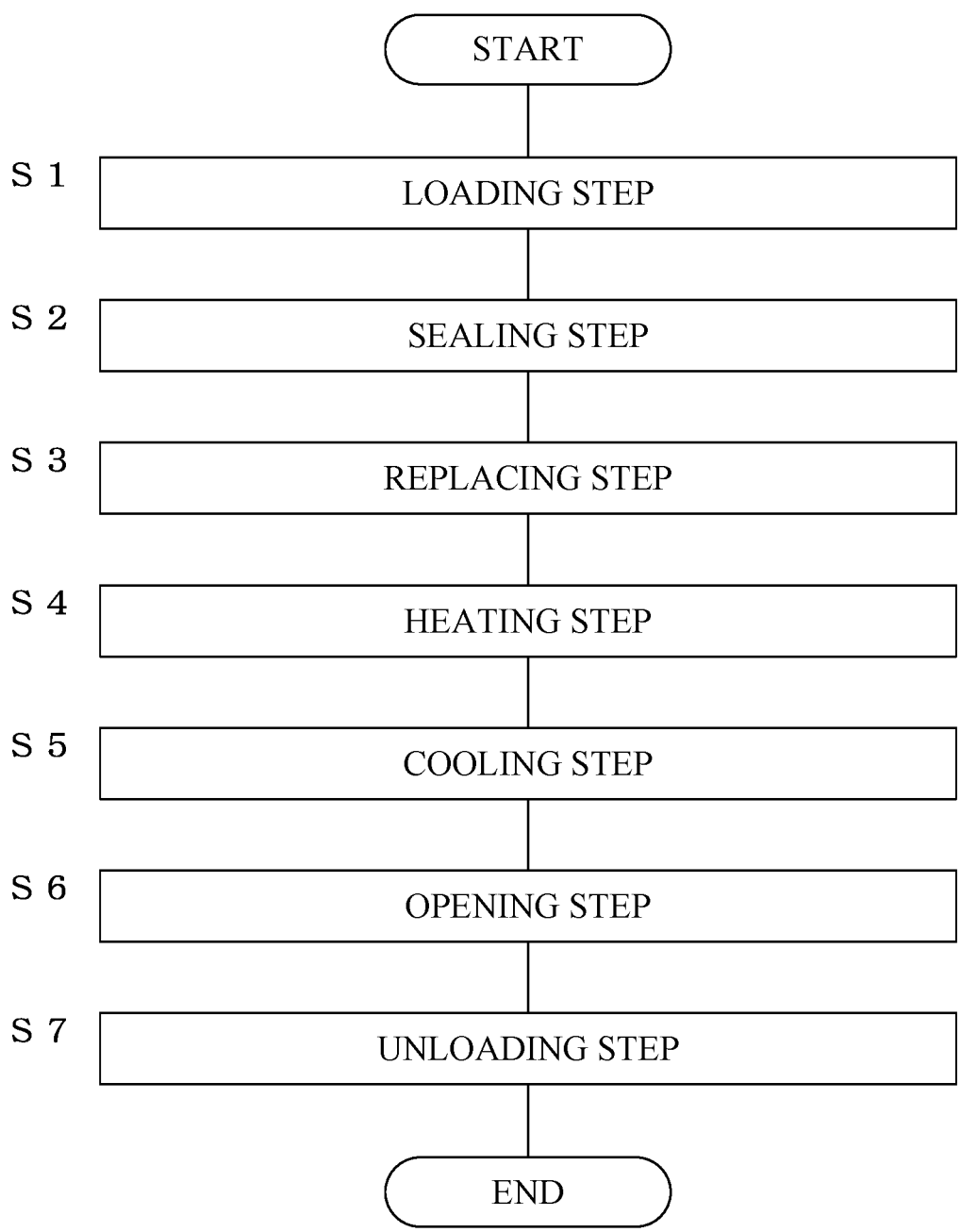
FIG. 9 is a flow chart illustrating one operational example of the substrate treating apparatus.

FIG. 9 is a flow chart illustrating a procedure of the operation example by the substrate treating apparatus 1. The operation example by the substrate treating apparatus 1 includes a loading step (Step S1), a sealing step (Step S2), a replacing step (Step S3), a heating step (Step S4), a cooling step (Step S5), an opening step (Step S6), and an unloading step (Step S7).

The lower exhaust section 81 exhausts gas during the entire period from the loading step to the unloading step. Moreover, the cooling water flows in the cooling units 16A to 16D and 47 during the entire period from the loading step to the unloading step.

Each of the steps is to be described hereunder. In the following operation example, elements are each operated through control by the controller 95.

<Step S1> Loading Step

The shutter drive mechanism 21 removes the shutter 5 from the casing 4. This opens the transportation port A. A substrate transport mechanism, not shown, loads the substrate W into the treatment container 3. Specifically, the substrate transport mechanism enters into the treatment container 3 through the transportation port A while holding the substrate W in a horizontal attitude. Accordingly, the substrate W is loaded into the treatment container 3 through the transportation port A. The substrate W has the directed self-assembly material already applied thereto. The pin drive mechanism 25 moves the pin 24 upwardly. The pin 24 receives the substrate W from the substrate transport mechanism. After the pin 24 receives the substrate W, the substrate transport mechanism moves to the exterior of the treatment container 3. The pin 24 supports the substrate W at the cooling position PC.

When the pin 24 is moved to the upper position, the pin 24 is moved upwardly along the axis C of the pin 24. When the pin 24 is moved upwardly, the pin 24 slides relative to the seal member 43. The seal member 43 continuously adheres to the pin 24 even when the pin 24 slides relative to the seal member 43.

As mentioned above, the lower exhaust section 81 exhausts gas from the seal housing 40 and the treatment container 3 in the loading step.

Figure 10:
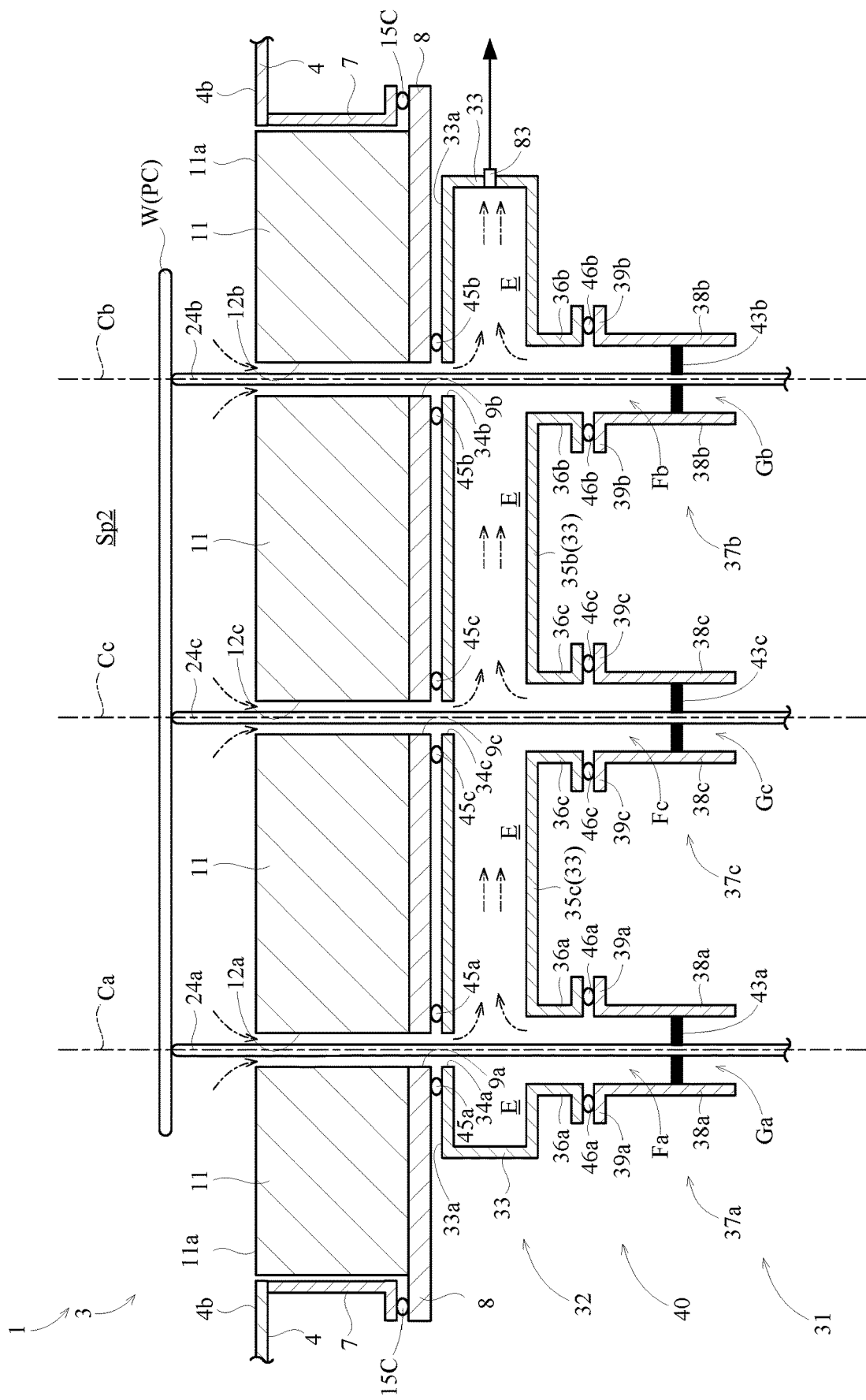
FIG. 10 schematically illustrates a principal part of the substrate treating apparatus.

FIG. 10 schematically illustrates a principal part of the substrate treating apparatus. FIG. 10 schematically indicates a flow of gas within the seal housing 40 and the treatment container 3 by alternate long and short dashed lines. The gas within the spaces Fa, Fb, and Fc each flows into the space E. The gas within the treatment chamber Sp2 flows into the space E through the pin hole 12 and the opening 9. Strictly speaking, the gas within the treatment chamber Sp2 flows into the space E through the clearance between the pin hole 12 and the pin 24 and the clearance between the opening 9 and the pin 24. In the space E, the gas flows toward the exhaust port 83. Moreover, the gas flows from the space E into the pipe 82 through the exhaust port 83. In this manner, the gas within the treatment container 3 and the gas within the seal housing 40 are exhausted through the exhaust port 83.

If dust is generated in the space Fa due to slide of the pin 24a relative to the seal member 43a, the dust enters from the space Fa into the exhaust port 83 through the space E. That is, the dust within the space Fa is also exhausted through the exhaust port 83. This accurately prevents the dust from entering into the treatment container 3. Moreover, the gas in the opening 9 flows from the treatment container 3 (pin hole 12) to the seal housing 40 (space E). Such gas flow suitably prevents the dust from entering from the seal housing 40 into the treatment container 3. Accordingly, this prevents the dust from entering into the treatment container 3 with much higher accuracy. Likewise, if the dust is generated in the spaces Fb and Fc, the dust is exhausted through the exhaust port 83 without entering into the treatment container 3.

If outside air enters into the space Fa through an adhesion portion between the pin 24 and the seal member 43a, the outside air also enters from the space Fa into the exhaust port 83 through the space E. That is, the outside air having entered into the space Fa is also exhausted through the exhaust port 83. This accurately prevents the outside air from entering into the treatment container 3. Moreover, the gas in the opening 9 flows from the treatment container 3 (pin hole 12) into the seal housing 40 (space E). Such gas flow suitably prevents the outside air from entering from the seal housing 40 into the treatment container 3. Accordingly, this prevents the outside air from entering into the treatment container 3 with much higher accuracy. Likewise, if the outside air enters into the spaces Fb and Fc, the outside air is exhausted through the exhaust port 83 without entering into the treatment container 3.

As noted above, the gas within the treatment container 3 and the gas within the seal housing 40 are exhausted through the exhaust port 83, achieving suitable prevention of the foreign substances, such as dust and outside air, from entering into the treatment container 3.

<Step S2> Sealing Step

The shutter drive mechanism 21 causes the shutter 5 to be attached to the casing 4. The shutter 5 adheres to the casing 4 via the seal member 15A. Accordingly, the transportation port A is sealed. That is, the treatment container 3 is substantially sealed. It should be noted that the pin 24 is located at the upper position and the substrate W is rest at the cooling position PC in the sealing step. Moreover, the lower exhaust section 81 exhausts the gas from the seal housing 40 and the treatment container 3 also in the sealing step.

<Step S3> Replacing Step

In a replacing step, gas within the treatment container 3 is replaced by non-oxidizing gas. Specifically, the non-oxidizing gas is supplied into the treatment container 3, and the gas within the treatment container 3 is exhausted. In the replacing step, the oxygen concentration within the treatment container 3 decreases as time elapses. It should be noted that the pin 24 is located at the upper position and the substrate W is rest at the cooling position PC in the replacing step.

Figure 11:
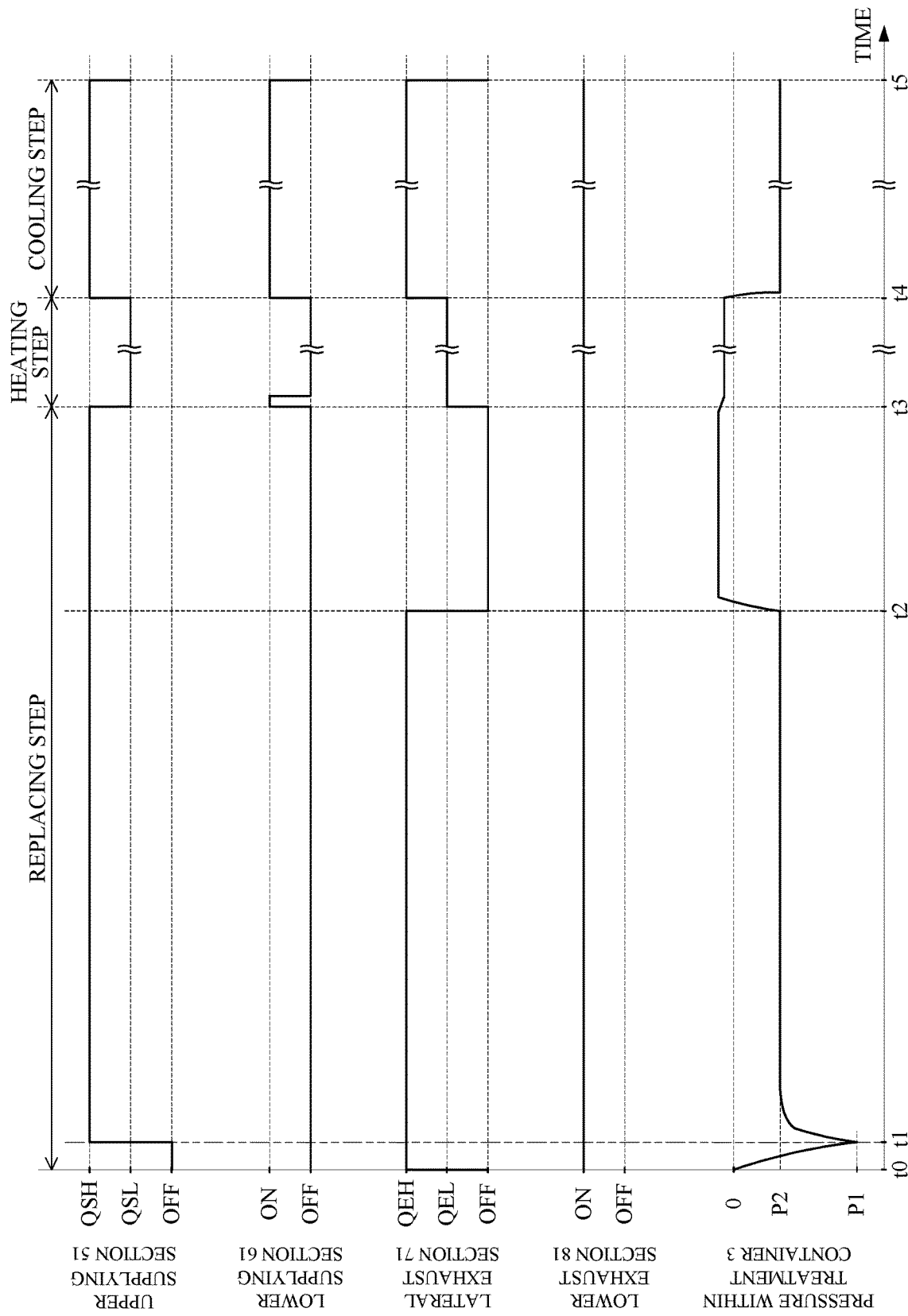
FIG. 11 is a timing chart illustrating a procedure of a replacing step, a heating step, and a cooling step.

FIG. 11 is a timing chart exemplarily illustrating a procedure of the replacing step, the heating step, and the cooling step. As illustrated in FIG. 11, the replacing step is performed during a period of time t0 to time t3. The replacing step includes a first process, a second process, and a third process. The first process is performed during a period of time t0 to time t1. The second process is performed during a period of time t1 to time t2. The third process is performed during a period of time t2 to time t3.

The first process performs vacuuming within the treatment container 3. Specifically, in the first process, the upper supplying section 51 and the lower supplying section 61 supply no non-oxidizing gas into the treatment container 3 while the lateral exhaust section 71 exhausts gas within the treatment container 3, and the lower exhaust section 81 exhausts gas within the seal housing 40 and the treatment container 3. The lateral exhaust section 71 exhausts the gas within the treatment container 3 through the lateral outlet D. The lateral exhaust section 71 exhausts gas at a relatively large exhaust amount QEH. The lower exhaust section 81 exhausts gas within the seal housing 40 and the treatment container 3 through the exhaust port 83. In the first process, pressure within the treatment container 3 sharply decreases. Here, pressure p1 of the gas within the treatment container 3 at the time t1 is, for example, −30 kPa. In the present specification, pressure is represented by gauge pressure with reference to the atmospheric pressure.

The opening 9 is sealed with the sealing mechanism 31, achieving a readily enhanced degree of vacuum within the treatment container 3. Moreover, the gas within the treatment container 3 is exhausted through not only the lateral outlet D but also the exhaust port 83, achieving easy reduction in pressure of the gas within the treatment container 3.

In the second process, the upper supplying section 51 supplies the non-oxidizing gas into the treatment container 3, and the lower supplying section 61 supplies no non-oxidizing gas into the treatment container 3. The lateral exhaust section 71 exhausts gas from the interior of the treatment container 3, and the lower exhaust section 81 exhaust the gas from the interior of the seal housing 40 and the treatment container 3. The upper supplying section 51 blows non-oxidizing gas through fine holes 56a of a straightening vane 56. The upper supplying section 51 supplies the non-oxidizing gas at a relatively large supply amount QSH. The lateral exhaust section 71 exhausts the gas at the exhaust amount QEH. In the second process, the pressure within the treatment container 3 is higher than the pressure p1. However, in the second process, the pressure within the treatment container 3 is still negative (i.e., lower than the atmospheric pressure). Here, pressure p2 within the treatment container 3 at the time t2 is, for example, −10 kPa.

In the third process, the upper supplying section 51 supplies the non-oxidizing gas into the treatment container 3, and the lower supplying section 61 supplies no non-oxidizing gas into the treatment container 3. The lateral exhaust section 71 exhausts no gas within the treatment container 3, and the lower exhaust section 81 exhausts the gas within the seal housing 40 and the treatment container 3. The upper supplying section 51 supplies the non-oxidizing gas at the supply amount QSH. In the third process, the pressure within the treatment container 3 is higher than the pressure p2. In the third process, the pressure within the treatment container 3 is positive (i.e., higher than the atmospheric pressure).

Figure 12:
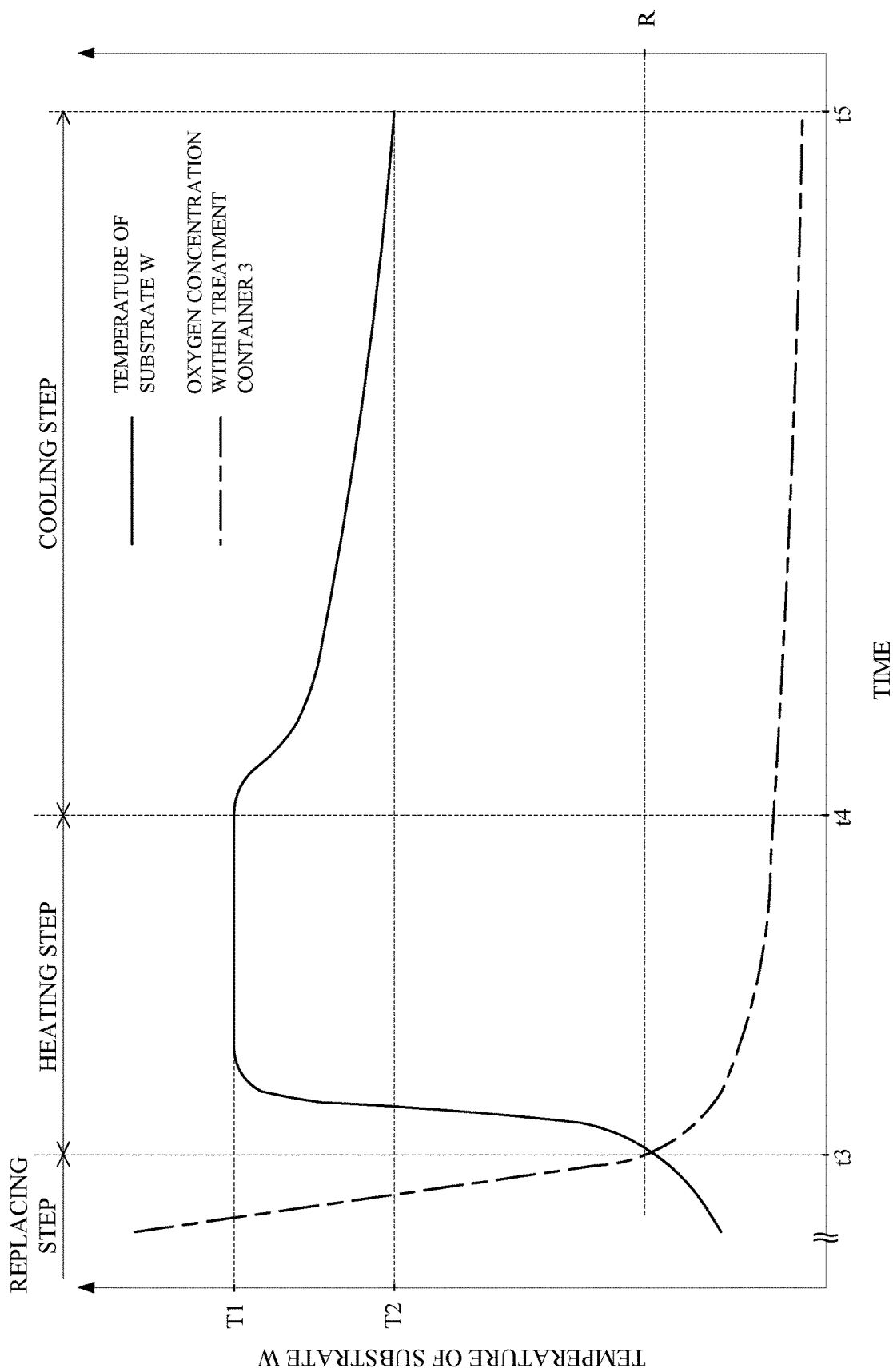
FIG. 12 is a graph illustrating a time variation in temperature of a substrate and in oxygen concentration within the treatment container.

FIG. 12 is a graph illustrating a time variation in temperature of the substrate W and in oxygen concentration within the treatment container 3. As illustrated, the oxygen concentration within the treatment container 3 falls to be equal to or less than a reference value R upon completion of the replacing step (i.e., at the time t3). In the present specification, the feature that the oxygen concentration within the treatment container 3 is equal to or less than the reference value R is equivalent to the feature that the interior of the treatment container 3 is under the non-oxidizing gas atmosphere.

It should be noted that the reference value R is, for example, within a range of 10 ppm to 10,000 ppm. Here, the oxygen concentration corresponds to a ratio of a volume of the gas within the treatment container 3 to a volume of the oxygen gas within the treatment container 3.

<Step S4> Heating Step

Reference is made to FIG. 11. The heating step is performed during a period of time t3 to time t4. In the heating step, the interior of the treatment container 3 is maintained at the non-oxidizing gas atmosphere. Moreover, in the heating step, the upper supplying section 51 supplies the non-oxidizing gas into the treatment container 3, the lateral exhaust section 71 exhausts the gas from the treatment container 3, and the lower exhaust section 81 exhausts gas from the seal housing 40 and treatment container 3. The upper supplying section 51 supplies the non-oxidizing gas at a supply amount QSL smaller than the supply amount QSH. The lateral exhaust section 71 exhausts the gas at an exhaust amount QEL smaller than the exhaust amount QEH. Here in the heating step, pressure within the treatment container 3 is positive.

In the heating step, the substrate W is moved to the heating position PH. Specifically, the support pin drive mechanism 25 moves the support pin 24 from the upper position to the lower position when the heating step starts (i.e., at the time t3). Accordingly, the substrate W is moved downwardly from the cooling position PC to the heating position PH. The substrate W is placed on the top face 11a of the heating unit 11.

When the pin 24 is moved from the upper position to the lower position, the pin 24 is moved downwardly along the axis C of the pin 24. The pin 24 slides relative to the seal member 43 while moving downwardly. The seal member 43 continuously adheres to the pin 24 even when the pin 24 slides relative to the seal member 43.

Moreover, the lower supplying section 61 supplies the non-oxidizing gas into the treatment container 3 only while the substrate W is moved from the cooling position PC to the heating position PH. The lower supplying section 61 blows the non-oxidizing gas through the gas flow hole 14 of the heating unit 11. This ensures prevention of stagnation oxygen at a clearance between the substrate W and the heating unit 11.

After the substrate W reaches the heating position PH, the substrate W is at rest at the heating position PH until the heating step is completed. The heating unit 11 heats the substrate W at the heating position PH. Heating the substrate W causes phase separation of the directed self-assembly material on the substrate W.

Reference is made to FIG. 12. In the heating step, the oxygen concentration within the treatment container 3 is maintained at the reference value R or less. That is, in the heating step, the substrate W is heated at the non-oxidizing gas atmosphere. In the heating step, the substrate W is heated at a temperature T1. Here, the temperature T1 is relatively high. For instance, the temperature T1 is 300° C. or more. The temperature T1 is, for example, equal to or more than a glass transition point of the directed self-assembly material. Here, the glass transition point is also referred to as a glass transition temperature. In the present embodiment, the temperature T1 falls within a range of 340° C. to 360° C., for example.

<Step S5> Cooling Step

Reference is made to FIG. 11. The cooling step is performed during a period of time t4 to time t5. Also in the cooling step, the interior of the treatment container 3 is maintained at the non-oxidizing gas atmosphere. Moreover, in the cooling step, the upper supplying section 51 and the lower supplying section 61 supply the non-oxidizing gas into the treatment container 3. The lateral exhaust section 71 exhausts the gas within the treatment container 3. The lower exhaust section 81 exhausts the gas within the seal housing 40 and the treatment container 3. The upper supplying section 51 supplies the non-oxidizing gas at a supply amount QSH. The lateral exhaust section 71 exhausts the gas at the exhaust amount QEH. In the cooling step, pressure within the treatment container 3 is negative.

In the cooling step, the substrate W is located at the cooling position PC. Specifically, the support pin drive mechanism 25 moves the pin 24 from the lower position to the upper position when the cooling step starts (i.e., at the time t4). This causes the substrate W to be moved upwardly from the heating position PH to the cooling position PC. After the substrate W reaches the cooling position PC, the substrate W is at rest at the cooling position PC until the cooling step is completed.

Reference is made to FIG. 12. Also in the cooling step, the oxygen concentration within the treatment container 3 is maintained at the reference value R or less. That is, also in the cooling step, the substrate W is cooled at the non-oxidizing gas atmosphere.

In the cooling step, the temperature of the substrate W is decreased to the temperature T2 or less. Here, the temperature T2 is lower than the temperature T1. For instance, it is preferred that the temperature T2 is a temperature of the substrate W at which no structure of the phase-separated directed self-assembly material substantially degrades or collapses even when the substrate W contacts gas whose oxygen concentration is almost equal to an oxygen concentration of atmospheres. For instance, it is preferred that the temperature T2 is equal to or less than the glass transition point of the directed self-assembly material. For instance, it is preferred that the temperature T2 is equal to or less than the glass transition point of the copolymer contained in the directed self-assembly material. Here, the glass transition point may be specified with literature values. Alternatively, the glass transition point may be specified by a differential scanning calorimetry (DSC). In the present embodiment, the temperature T2 falls within a range of 240° C. to 260° C.

<Step S6> Opening Step

Reference is made to FIG. 1. The shutter drive mechanism 21 removes the shutter 5 from the casing 4. This opens the transportation port A. The treatment container 3 is opened.

<Step S7> Unloading Step

The substrate transport mechanism, not show, unloads the substrate W from the treatment container 3. Specifically, the substrate transport mechanism enters into the treatment container 3 through the transportation port A. The pin drive mechanism 25 moves the pin 24 downwardly from the upper position. The substrate transport mechanism receives the substrate W from the pin 24. Thereafter, the substrate transport mechanism moves to the exterior of the treatment container 3.

3. Effect of Embodiment

The substrate treating apparatus 1 of the present embodiment produces the following effects as under.

The substrate treating apparatus 1 includes the seal housing 40 and the seal member 43. The seal housing 40 is in close contact with the treatment container 3 around the opening 9, and accommodates a part of the pin 24. The seal member 43 is in close contact with the inner peripheral surface of the seal housing 40 and the outer peripheral surface of the pin 24. This suitably seals the opening 9. Accordingly, suitably enhances airtightness of the treatment container 3 is obtainable.

The seal member 43 is in close contact with the pin 24 so as to be slidable with the pin 24. That is, the seal member 43 continuously adheres to the pin 24 even when the pin 24 slides relative to the seal member 43. Consequently, the airtightness of the treatment container is suitably maintainable even when the pin 24 reciprocates.

The seal housing 40 is disposed in the exterior of the treatment container 3, and accordingly, the seal member 43 is also disposed in the exterior of the treatment container 3. Since the seal member 43 is disposed in the exterior of the treatment container 3, the seal member 43 does not receive heat of the heating unit 11 directly. That is, the seal member 43 is suitably protectable from the heat within the treatment container 3. Accordingly, degradation of the seal member 43 is suitably avoidable. In other words, the seal member 43 has a suitably maintained seal function. This allows suitable maintenance of the airtightness of the treatment container 3.

As noted above, the airtightness of the treatment container 3 is able to be enhanced suitably, and accordingly, this leads to suitable control of the atmosphere within the treatment container 3. For instance, as in the replacing step, the concentration of the non-oxidizing gas in the treatment container 3 is sufficiently increased. In other words, a concentration of impurities (e.g., oxygen or particles) for the non-oxidizing gas is sufficiently decreased. For instance, as in the heating step and the cooling step, the interior of the treatment container 3 is readily maintainable at the non-oxidizing gas atmosphere.

In addition, the airtightness of the treatment container 3 is suitably enhanced, and accordingly this leads to suitable control of gas pressure within the treatment container 3. For instance, as in the third process of the replacing step and the heating step, the gas pressure within the treatment container 3 is readily made positive. For instance, as in the first process and the second process of the replacing step, and the cooling step, the gas pressure within the treatment container 3 is readily made negative. For instance, as in the first process of the replacing step, a degree of vacuum within the treatment container 3 is readily enhanced. For instance, the gas pressure within the treatment container 3 is adjustable to a predetermined value.

As noted above, since the atmosphere within the treatment container 3 as well as the gas pressure within the treatment container 3 are suitably controllable, a quality of treating the substrate W with the substrate treating apparatus 1 is suitably increased.

Since the pin 24 is disposed in the pin hole 12 of the heating unit 11, the pin 24 directly receives heat of the heating unit 11. On the other hand, the seal member 43 is disposed in the exterior of the treatment container 3, the seal member 43 does not receive heat of the heating unit 11 directly. Consequently, even if the pin 24 has relatively high temperatures, the seal member 43 is able to adhere to the pin 24 without any degradation of the seal member 43. This allows suitable maintenance of the airtightness of the treatment container 3. As above, the sealing mechanism 31 possesses especially usability when the pin 24 passes through the heating unit 11.

Since the seal member 43 is made of metal, and accordingly the seal member 43 possesses high heat resistance. This allows the seal member 43 to maintain its seal function more suitably. Consequently, the airtightness of the treatment container 3 is maintainable more suitably.

The seal housing 40 is in close contact with the treatment container 3 around the opening 9a, the opening 9b, and the opening 9c. The seal housing 40 accommodate parts of the pins 24a, 24b and 24c, respectively. In addition, the seal housing 40 is in close contact with the seal members 43a, 43b, and 43c. The seal members 43a, 43b, and 43c are in close contact with the pin 24a, 24b, and 24c, respectively. Such a configuration allows suitably sealing of the opening 9a, 9b, and 9c, respectively. Especially, three shaft sealings (i.e., sealing of the pins 24a, 24b, and 24c) are performable in the one seal housing 40. This simplifies the configuration of the sealing mechanism 31.

The seal housing 40 includes the cylinder 38, achieving appropriate location of the seal member 43.

Since the seal housing 40 includes the aggregated part 33, the interiors of the cylinders 38a, 38b, and 38c is in suitable communication with one another. In other words, the spaces Fa, Fb, and Fc are suitably in communication with one another by the aggregated part 33.

The aggregated part 33 includes the pipe 35a that extends between the pins 24a and 24b in a direction substantially orthogonal to the axis C of the pin 24. This leads to a relatively shortened length of the pipe 35a. This simplifies the configuration of the aggregated part 33. Likewise, the aggregated part 33 includes the pipe 35b that extends between the pins 24b and 24c in a direction substantially orthogonal to the axis C of the pin 24. The aggregated part 33 includes the pipe 35c that extends between the pins 24c and 24a in a direction substantially orthogonal to the axis C of the pin 24. This further simplifies the configuration of the aggregated part 33.

The aggregated part 33 has the planar top face 33a. Accordingly, the aggregated part 33 suitably adheres to the treatment container 3.

The sealing mechanism 31 includes the seal member 45. Accordingly, the aggregated part 33 suitably adheres to the treatment container 3 via the seal member 45.

The cylinder 38 is separable from the aggregated part 33. Specifically, the shaft sealing part 37 is separable from the manifold 32. Accordingly, the cylinder 38, the seal member 43, and the pin 24 are integrally separable from the aggregated part 33. In other words, the cylinder 38, the seal member 43, and the pin 24 are separable from the aggregated part 33 in the state where the cylinder 38, the seal member 43, and the pin 24 adhere to one another. This allows maintenance of the substrate treating apparatus 1 without separation of the seal member 43 from the pin 24 and the cylinder 38. Consequently, a replacement frequency of the seal member 43 is decreased. It should be noted that the seal member 43 is made of metal. In this case, once the seal member 43 is removable from the pin 24 or the cylinder 38, the seal member 43 needs to be replaced.

The manifold 32 includes the joint 36, and the shaft sealing part 37 includes the joint 39. Accordingly, the shaft sealing part 37 is removably attached to the manifold 32 with ease. In other words, the cylinder 38 is removably attached to the aggregated part 33 with ease. Moreover, the manifold 32 is brought into connection with the shaft sealing part 37 in the airtight and communicated manner.

The substrate treating apparatus 1 includes the exhaust port 83 that exhausts the gas within the seal housing 40. The exhaust port 83 is in connection with the seal housing 40 in a communicated manner. Accordingly, the gas in the interior of the seal housing 40 is able to be exhausted to the exterior of the seal housing 40 via the exhaust port 83. This suitably prevents foreign substances such as dust or outside air from entering into the treatment container 3. This controls the atmosphere within the treatment container 3 more suitably.

The exhaust port 83 is in connection with the aggregated part 33 in a communicated manner. Accordingly, the gas within the spaces E, Fa, Fb, and Fc is efficiently exhausted through the one first exhaust port 83.

The treatment container 3 and the seal housing 40 are in communication with each other via the opening 9. Accordingly, the gas within the treatment container 3 is able to be exhausted through the exhaust port 83. Consequently, this lowers pressure within the treatment container 3 more easily.

At the opening 9, the gas flows from the treatment container 3 to the seal housing 40. This suitably prevents the foreign substances such as dust or outside air from entering from the seal housing 40 into the treatment container 3. Consequently, this controls the atmosphere within the treatment container 3 more suitably.

The seal housing 40 is also in communication with the pin hole 12. Accordingly, the gas in the pin hole 12 is able to be exhausted via the exhaust port 83. Consequently, this controls the gas in the pin hole 12 more suitably.

The pin hole 12 is opened toward the above of the heating unit 11. Accordingly, the gas above of the heating unit 11 is readily exhausted through the pin hole 12. This achieves more suitable control of the gas the above of the heating unit 11.

The cooling unit 47 is disposed adjacent to the sealing mechanism 31. This causes the cooling unit 47 to suitably cool the seal housing 40 and the seal member 43. That is, the excessively heightened temperature of the seal member 43 is preventable. This suitably prevents degradation of the seal member 43. Consequently, the airtightness of the treatment container 3 is able to be maintained suitably.

The cooling unit 47 is disposed adjacent to the sealing mechanism 31, and the sealing mechanism 31 is in close contact with the pin 24. This allows the cooling unit 47 to cool the pin 24 additionally. Accordingly, the excessively heightened temperature of the pin 24 is preventable. This suitably prevents the pin 24 from being damaged and being deformed in shape of the pin 24. As a result, the pin 24 is able to be support the substrate W appropriately.

The cooling unit 47 is disposed adjacent to the seal housing 40. This allows the cooling unit 47 to cool the seal housing 40 and the seal member 43 suitably.

The cooling unit 47 surrounds the seal housing 40. This allows the cooling unit 47 to cool a wide area of the seal housing 40. Consequently, the cooling unit 47 performs effective cooling of the seal housing 40.

The cooling unit 47 is disposed adjacent to the aggregated part 33. This allows the cooling unit 47 to cool the aggregated part 33 suitably. In addition, the aggregated part 33 is connected to the cylinder 38. This allows the cooling unit 47 to suitably cool the cylinder 38.

The cooling unit 47 includes the cooling channel through which cooling water flows. Accordingly, heat of the seal housing 40 is transmitted to the cooling water effectively. This causes the cooling unit 47 to cool the seal housing 40 effectively.

The seal housing 40 is made of metal. Accordingly, the seal housing 40 has a relatively high thermal conductivity. This allows the cooling unit 47 to cool the seal housing 40 effectively.

The seal member 43 is made of metal. Accordingly, the seal member 43 has a relatively high thermal conductivity. This allows the cooling unit 47 to cool the seal member 43 effectively.

The cooling unit 16A is disposed adjacent to the seal member 15A. This allows the cooling unit 16A to cool the seal member 15A. That is, the excessively heightened temperature of the seal member 15A is preventable. This suitably prevents degradation of the seal member 15A. Consequently, the transportation port A is able to be sealed suitably.

The cooling unit 16B is disposed adjacent to the seal member 15B. This allows the cooling unit 16B to cool the seal member 15B. This suitably prevents degradation of the seal member 15B. Consequently, the upper opening B is able to be sealed suitably.

The cooling unit 16C is disposed adjacent to the seal member 15C. This allows the cooling unit 16C to cool the seal member 15C. This suitably prevents degradation of the seal member 15C. Consequently, the lower opening C is able to be sealed suitably.

The cooling unit 16D is disposed adjacent to the seal member 15D. This allows the cooling unit 16D to cool the seal member 15D. This suitably prevents degradation of the seal member 15D. Consequently, the exhaust duct 72 is able to be in communication with the lateral outlet D in an airtight manner.

The present invention is not limited to the foregoing examples, but may be modified as follows.

(1) In the embodiment mentioned above, the manifold 32 includes the joint 36. However, this is not limitative. For instance, the joint 36 is omittable. For instance, the aggregated part 33 may be directly connected to the shaft sealing part 37. In this modification, the aggregated part 33, the cylinder 38, and the joint 39 constitute the seal housing 40.

(2) In the embodiment mentioned above, the shaft sealing part 37 includes the joint 39. However, this is not limitative. For instance, the joint 39 is omittable. For instance, the cylinder 38 may be directly connected to the manifold 32. In this modification, the aggregated part 33, the joint 36, and the cylinder 38 constitute the seal housing 40.

(3) In the embodiment mentioned above, the aggregated part 33 is indirectly in connection with the cylinder 38. However, this is not limitative. That is, the aggregated part 33 may be directly connected to the cylinder 38. For instance, the joints 36 and 39 are omittable. In this modification, the aggregated part 33 and the cylinder 38 constitute the seal housing 40.

(4) In the embodiment mentioned above, the sealing mechanism 31 includes the manifold 32. However, this is not limitative. For instance, the manifold 32 is omittable. For instance, the shaft sealing part 37 may be directly connected to the treatment container 3.

Figure 13:
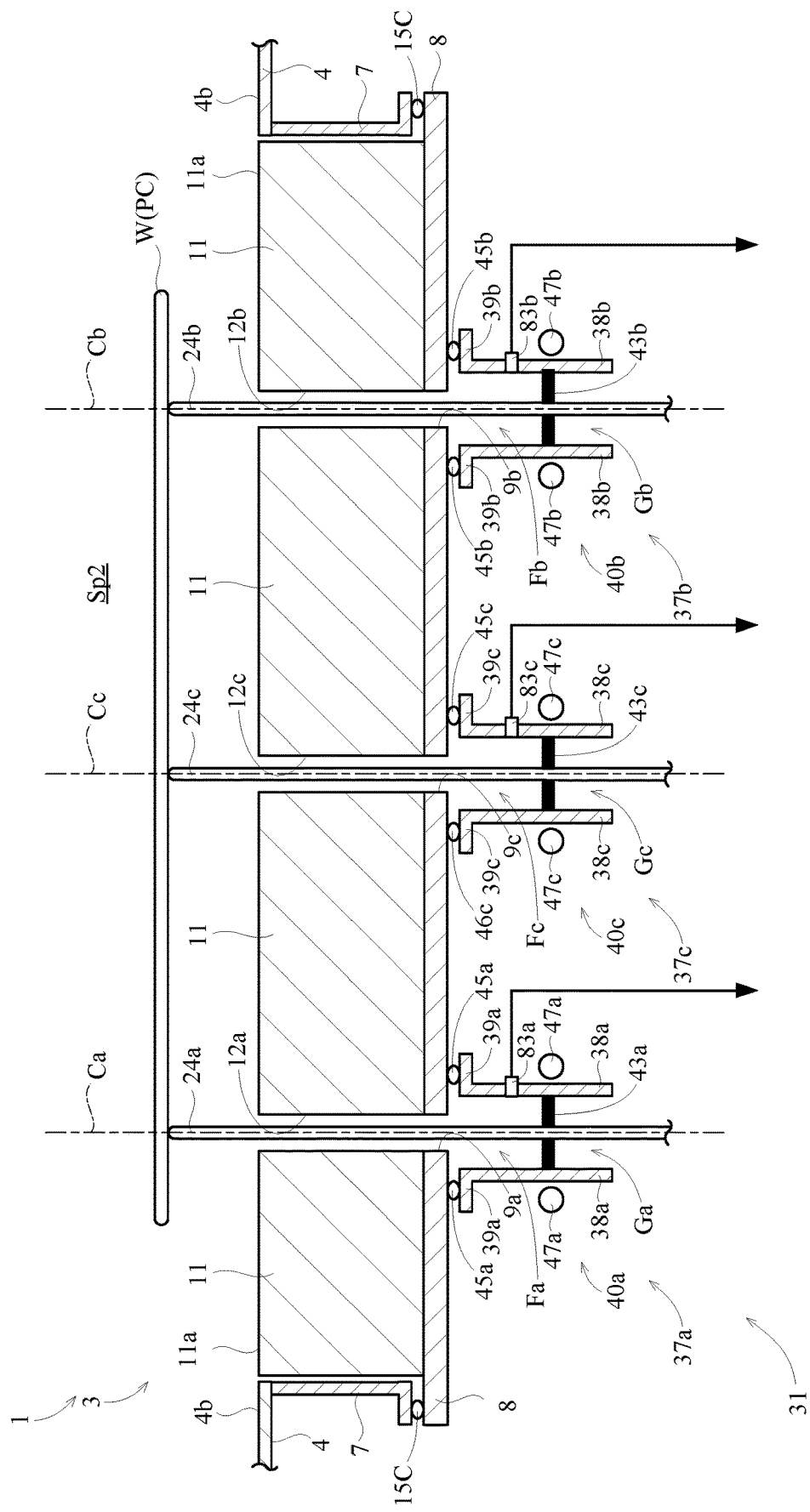
FIG. 13 schematically illustrates a principal part of a substrate treating apparatus according to one modification.

FIG. 13 schematically illustrates a principal part of the substrate treating apparatus 1 according to one modification. It should be noted that the same parts as the parts in the above embodiment are designated by similar numerals for omitting detailed description thereof.

The shaft sealing part 37a is in close contact with the treatment container 3 around the opening 9a. Specifically, a joint 39a adheres to the base board 8 via the seal member 45a. The shaft sealing part 37b is in close contact with the treatment container 3 around the opening 9b. Specifically, a joint 39b adheres to the base board 8 via the seal member 45b. The shaft sealing part 37c is in close contact with the treatment container 3 around the opening 9c. Specifically, a joint 39c adheres to the base board 8 via the seal member 45c.

In the present modification, the cylinder 38a and the joint 39a constitute the seal housing 40a. The space Fa corresponds to an interior of the seal housing 40a. The seal housing 40a accommodates a part of the pin 24a. The seal housing 40a and the seal member 43a seal the pin 24a. The seal housing 40a and the seal member 43a seal the opening 9a.

The cylinder 38b and the joint 39b constitute the seal housing 40b. The space Fb corresponds to an interior of the seal housing 40b. The seal housing 40b accommodates a part of the pin 24b. The seal housing 40b and the seal member 43b seal the pin 24b. The seal housing 40b and the seal member 43b seal the opening 9b.

The cylinder 38c and the joint 39c constitute the seal housing 40c. The space Fc corresponds to an interior of the seal housing 40c. The seal housing 40c accommodates a part of the pin 24c. The seal housing 40c and the seal member 43c seal the pin 24c. The seal housing 40c and the seal member 43c seal the opening 9c.

The substrate treating apparatus 1 includes the cooling units 47a, 47b, and 47c. The cooling unit 47a is disposed adjacent to the cylinder 38a. The cooling unit 47a cools the cylinder 38a, the seal member 43a, and the pin 24a. The cooling unit 47b is disposed adjacent to the cylinder 38b. The cooling unit 47b cools the cylinder 38b, the seal member 43b, and the pin 24b. The cooling unit 47c is disposed adjacent to the cylinder 38c. The cooling unit 47c cools the cylinder 38c, the seal member 43c, and the pin 24c.

The substrate treating apparatus 1 includes exhaust ports 83a, 83b, and 83c. The exhaust port 83a is in connection with the cylinder 38a in a communicated manner. The gas within the seal housing 40a (i.e., gas within the space Fa) is exhausted through the exhaust port 83a. The exhaust port 83b is in connection with the cylinder 38b in a communicated manner. The gas within the seal housing 40b (i.e., gas within the space Fb) is exhausted through the exhaust port 83b. The exhaust port 83c is in connection with the cylinder 38c in a communicated manner. The gas within the seal housing 40c (i.e., gas within the space Fc) is exhausted through the exhaust port 83c.

With the present modification, the airtightness of the treatment container 3 is able to be enhanced in the same manner as the present embodiment.

Moreover, the seal housing 40a is in close contact with one seal member 43a. This simplifies the configuration of the seal housing 40a. Specifically, the interior of the seal housing 40a has a simplified shape. Likewise, the seal housing 40b is in close contact with one seal member 43b. This simplifies the configuration of the seal housing 40b. The seal housing 40c is in close contact with one seal member 43c. This simplifies the configuration of the seal housing 40c.

As mentioned above, the interior of the seal housing 40a has a simplified shape. Accordingly, the gas within the seal housing 40a is able to be exhausted uniformly through the exhaust port 83a. Likewise, the gas within the seal housing 40b is able to be exhausted uniformly through the exhaust port 83b. the gas within the seal housing 40c is able to be exhausted uniformly through the exhaust port 83c.

The cooling unit 47a is disposed adjacent to the cylinder 38a. Such arrangement of the cooling unit 47a cools the seal member 43a and the pin 24a effectively. Likewise, such arrangement of the cooling unit 47b cools the seal member 43b and the pin 24b effectively. Likewise, such arrangement of the cooling unit 47c cools the seal member 43c and the pin 24c effectively.

One of the seal housings 40a, 40b, and 40c is one example of the first seal housing in the present invention. Another one of the seal housings 40a, 40b, and 40c is one example of the second seal housing in the present invention. One of the exhaust ports 83a, 83b, and 83c is one example of the first exhaust port in the present invention. Another one of the exhaust ports 83a, 83b, and 83c is one example of the second exhaust port in the present invention. The cooling units 47a, 47b, and 47c are one example of the cooling unit in the present invention.

(5) In the embodiment mentioned above, the sealing mechanism 31 includes the shaft sealing part 37. However, this is not limitative. For instance, the shaft sealing part 37 is omittable. For instance, the seal member 43 may be directly in close contact with the aggregated part 33.

Figure 14:
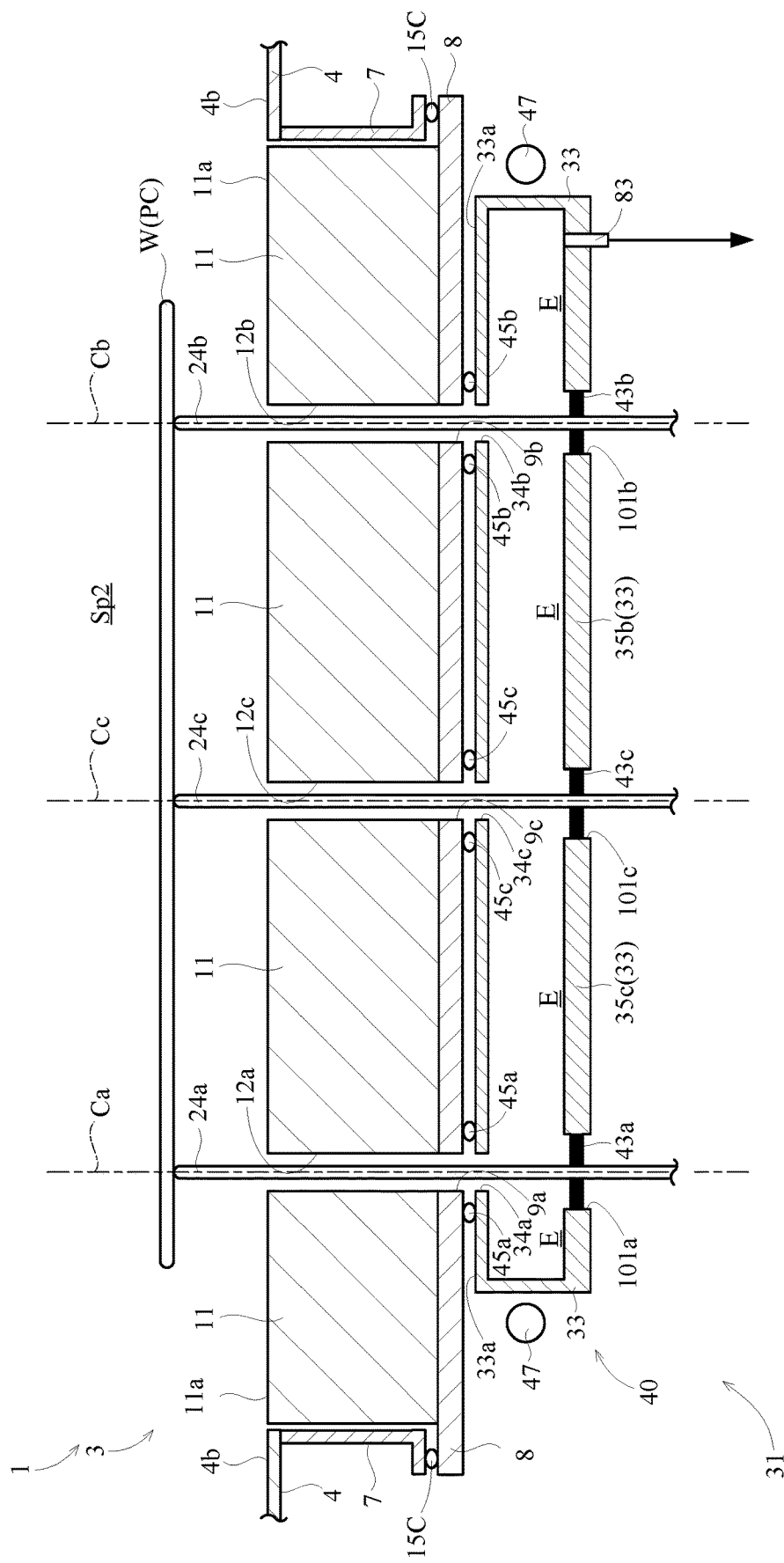
FIG. 14 schematically illustrates a principal part of a substrate treating apparatus according to another modification.

FIG. 14 schematically illustrates a principal part of the substrate treating apparatus 1 according to another modification. It should be noted that the same parts as the parts in the above embodiment are designated by similar numerals for omitting detailed description thereof.

The seal members 43a, 43b, and 43c are each in close contact with the aggregated part 33. Specifically, the aggregated part 33 includes three attaching ports 101a, 101b, and 101c on its lower surface. The seal members 43a, 43b, and 43c adhere to inner peripheral surfaces of the attaching ports 101a, 101b, and 101c, respectively.

In the present modification, the aggregated part 33 constitutes a seal housing 40. The space E corresponds to an interior of the seal housing 40. The seal housing 40, i.e., aggregated part 33, and the seal members 43a, 43b, and 43c seal the pins 24a, 24b, and 24c. The seal housing 40, i.e., the aggregated part 33, and the seal member 43a, 43b, and 43c seal the openings 9a, 9b, and 9c.

With the present modification, the airtightness of the treatment container 3 is able to be enhanced in the same manner as the present embodiment.

(6) In the embodiment mentioned above, the aggregated part 33 is directly connected to the treatment container 3. However, this is not limitative. That is, the aggregated part 33 may be indirectly connected to the treatment container 3. For instance, the manifold 32 may include a joint for being brought into close contact with the treatment container 3. The joint is in connection with the aggregated part 33 in a communicated manner, and also adheres to the treatment container 3.

(7) In the embodiment mentioned above, the shaft sealing part 37 is separable from the manifold 32. However, this is not limitative. That is, the shaft sealing part 37 is not separable from the manifold 32. In the present modification, the pin 24, the shaft sealing part 37, and the manifold 32 are integrally separable from the treatment container 3. Accordingly, maintenance of the substrate treating apparatus 1 is performable with no separation of the seal member 43 from the pin 24 and the cylinder 38. This reduces a replacement frequency of the seal member 43.

(8) In the embodiment mentioned above, the exhaust port 83 is in connection with the aggregated part 33 in a communicated manner. However, this is not limitative. For instance, the exhaust port 83 may be in connection with the shaft sealing part 37 in a communicated manner.

(9) In the embodiment mentioned above, the number of the exhaust port 83 is one. However, this is not limitative. For instance, a plurality of exhaust ports 83 may be provided.

(10) In the embodiment mentioned above, the substrate treating apparatus 1 includes the exhaust port 83. However, this is not limitative. For instance, the exhaust port 83 is omittable.

(11) In the embodiment mentioned above, the cooling unit 47 is disposed adjacent to the aggregated part 33. However, this is not limitative. The location of the cooling unit 47 is variable appropriately. For instance, the cooling unit 47 may be disposed adjacent to the cylinder 38. Alternatively, the cooling unit 47 may be disposed in the interior of the seal housing 40.

(12) In the embodiment mentioned above, the cooling unit 47 is a cooling pipe. However, this is not limitative. For instance. the cooling unit 47 may be a cooling plate. For instance, the cooling unit 47 may be a cooling channel formed in a wall of the aggregated part 33. For instance, the cooling unit 47 may be a cooling channel formed in a wall of the cylinder 38. For instance, the cooling unit 47 may be a cooling jacket attached to an outer wall of the aggregated part 33. For instance, the cooling unit 47 may be a cooling jacket attached to the outer peripheral surface of the cylinder 38.

(13) In the embodiment mentioned above, the cooling unit 47 uses cooling water. However, this is not limitative. That is, the cooling unit 47 may use a heating medium other than water.

(14) In the embodiment mentioned above, the substrate treating apparatus 1 includes the cooling unit 47. However, this is not limitative. For instance, the cooling unit 47 is omittable.

(15) In the embodiment mentioned above, the pin 24 is a member for supporting the substrate W. However, this is not limitative. For instance, the pin 24 may be replaced by a shaft member for holding the heating unit 11 or the straightening vane 56. For instance, the pin 24 may be replaced by a shaft member for supplying at least either gas or a liquid. For instance, the pin 24 may be replaced by a shaft member for suction-holding the substrate W.

(16) In the mentioned above, the pin 24 has no hollow part inside thereof. However, this is not limitative. The pin 24 may have a hollow part inside thereof. For instance, the pin 24 may be a double tube or a triple tube.

(17) In the embodiment mentioned above, three pins 24 are provided. However, this is not limitative. For instance, the number of pins 24 may be one, two, or four or more. Moreover, the numbers of the openings 9, the pin holes 12, the openings 34, and the shaft sealing parts 37 are each variable in accordance with the number of pins 24.

(18) In the embodiment mentioned above, the pin 24 is movable between the two positions (i.e., the upper and lower positions). However, this is not limitative. For instance, the pin 24 is movable among three or more positions.

(19) In the embodiment mentioned above, the substrate treating apparatus 1 performs the heat treatment including heating the substrate W and cooling the substrate W. However, this is not limitative. For instance, the substrate treating apparatus 1 performs the heat treatment including either heating the substrate W or cooling the substrate W.

(20) In the embodiment mentioned above, the substrate treating apparatus 1 performs the heat treatment. However, this is not limitative. For instance, the substrate treating apparatus 1 may perform treatment other than the heat treatment. In the embodiment mentioned above, the substrate treating apparatus 1 performs the treatment without using any processing liquid. However, this is not limitative. For instance, the substrate treating apparatus 1 performs the treatment using a processing liquid (e.g., a solvent or a hydrophobic treatment agent).

(21) The embodiment mentioned above exemplifies the cooling unit 16. However, the configuration and the location of the cooling unit 16 is variable appropriately. For instance, the cooling unit 16A may be a cooling channel formed in the shutter 5. The cooling unit 16A may be a pipe for passing the cooling water. The cooling unit 16A may be thermally connected to the seal member 15A via the shutter 5. The cooling units 16B to 16D are variable appropriately in the same manner as above.

(22) In the embodiment mentioned above, the substrate treating apparatus 1 performs the heat treatment of the substrate W having the directed self-assembly material applied thereto. However, this is not limitative. The substrate treating apparatus 1 may perform treatment of a substrate W having a resist film or an antireflection film formed thereon. For instance, the substrate treating apparatus 1 may perform treatment of a substrate W having a lower film formed thereon. The lower film is, for example, an SOC (Spin on Carbon) film or an SOG (Spin On Glass) film.

(23) The present embodiments and the modifications in the above (1) to (22) are variable appropriately by replacing or combining the element of the present embodiment or the modifications with the other element thereof.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus, comprising:
a treatment container configured to treat a substrate, the treatment container having:
  a casing;
  a lid removably attached to the casing;
  a transportation port through which the substrate is passed;
  a shutter for opening and closing the transportation port; and
  a first opening;
a first shaft member that is disposed between an interior of the treatment container and an exterior of the treatment container through the first opening, and that is configured to reciprocate in an axis direction of the first shaft member;
a first seal housing that is disposed in the exterior of the treatment container, that is in close contact to the treatment container around the first opening, and that accommodates a part of the first shaft member,
a first seal member that is in close contact with an inner peripheral surface of the first seal housing, and that is in close contact with an outer peripheral surface of the first shaft member so as to be slidable relative to the first shaft member; and a first exhaust port that is in connection with the first seal housing in a communicated manner, and that is configured to exhaust gas within the first seal housing.

2. The substrate treating apparatus according to claim 1, wherein
when the first shaft member reciprocates in the axis direction of the first shaft member relative to the first seal member, the first shaft member slides relative to the first seal member in a state where the first shaft member is in close contact with the first seal member.

3. The substrate treating apparatus according to claim 1, wherein
the treatment container and the first seal housing are in communication with each other via the first opening,
gas in the first seal housing and gas in the treatment container are capable of being exhausted through the first exhaust port,
the first opening is formed at a position different from the transportation port, and
the first opening is smaller than the substrate.

4. The substrate treating apparatus according to claim 1, further comprising:
a heating unit that is disposed in the interior of the treatment container, and that is configured to heat the substrate, wherein
the heating unit includes a through hole formed in the heating unit, and
the first shaft member is disposed in the through hole.

5. The substrate treating apparatus according to claim 4, wherein
the first seal housing is in communication with the through hole.

6. The substrate treating apparatus according to claim 1, wherein
the treatment container further comprises a second opening,
the substrate treating apparatus further includes a second shaft member that is disposed between the interior of the treatment container and the exterior of the treatment container through the second opening, and that is configured to reciprocate in an axis direction of the second shaft member,
the first seal housing is in close contact with the treatment container around the second opening, and accommodates a part of the second shaft member, and
the substrate treating apparatus further comprises a second seal member that is in close contact with an inner peripheral surface of the first seal housing, and that is in close contact with an outer peripheral surface of the second shaft member so as to be slidable relative to the second shaft member.

7. The substrate treating apparatus according to claim 6, wherein
the first seal housing comprises:
a collector that is in close contact with the treatment container around the first opening and the second opening,
a first cylinder that is in connection with the collector in a communicated manner, and
a second cylinder that is in connection with the collector in a communicated manner, wherein
a part of the first shaft member is accommodated into the collector and the first cylinder,
a part of the second shaft member is accommodated into the collector and the second cylinder,
the first seal member is in close contact with an inner peripheral surface of the first cylinder,
the second seal member is in close contact with an inner peripheral surface of the second cylinder, and
the first exhaust port is in connection with the collector in a communicated manner.

8. The substrate treating apparatus according to claim 7, wherein
the first cylinder is separable from the collector, and
the second cylinder is separable from the collector.

9. The substrate treating apparatus according to claim 7, wherein
the collector includes a first pipe that extends between the first shaft member and the second shaft member in a direction substantially orthogonal to the axis direction of the first shaft member.

10. The substrate treating apparatus according to claim 1, wherein
the substrate treating apparatus further includes a cooling unit that is disposed adjacent to the first seal housing.

11. A substrate treating apparatus, comprising:
a treatment container configured to treat a substrate, the treatment container having:
a casing;
a lid removably attached to the casing;
a transportation port through which the substrate is passed;
a shutter for opening and closing the transportation port; and
a first opening;
a first shaft member that is disposed between an interior of the treatment container and an exterior of the treatment container through the first opening, and that is configured to reciprocate in an axis direction of the first shaft member;
a sealing mechanism configured to seal the first opening while allowing reciprocation of the first shaft member; and
a cooling unit that is disposed in the exterior of the treatment container and adjacent to the sealing mechanism, and that is configured to cool the sealing mechanism, wherein
the sealing mechanism comprises:
a first seal housing that is disposed in the exterior of the treatment container, that is in close contact with the treatment container around the first opening, and that accommodates a part of the first shaft member; and
a first seal member that is in close contact with an inner peripheral surface of the first seal housing, and that is in close contact with an outer peripheral surface of the first shaft member so as to be slidable relative to the first shaft member.

12. The substrate treating apparatus according to claim 11, wherein
the cooling unit surrounds the first seal housing.

13. The substrate treating apparatus according to claim 11, wherein
the cooling unit includes a cooling channel through which cooling water flows.

14. The substrate treating apparatus according to claim 11, wherein
when the first shaft member reciprocates in the axis direction of the first shaft member relative to the first seal member, the first shaft member slides relative to the first seal member in a state where the first shaft member is in close contact with the first seal member.

15. The substrate treating apparatus according to claim 11, wherein the first opening is formed at a position different from the transportation port, and the first opening is smaller than the substrate.

16. The substrate treating apparatus according to claim 11, further comprising:

a heating unit that is disposed in the interior of the treatment container, and that is configured to heat the substrate, wherein the heating unit includes a through hole that is formed in the heating unit, and the first shaft member is disposed in the through hole.

17. The substrate treating apparatus according to claim 11, wherein the treatment container comprises a second opening;

the substrate treating apparatus further includes a second shaft member that is disposed between the interior of the treatment container and the exterior of the treatment container through the second opening, and that is configured to reciprocate in an axis direction of the second shaft member, the first seal housing is in close contact with the treatment container around the second opening, and accommodates a part of the second shaft member, the sealing mechanism includes a second seal member that is in close contact with an inner peripheral surface of the first seal housing, and is in close contact with an outer peripheral surface of the second shaft member so as to be slidable relative to the second shaft member.

18. The substrate treating apparatus according to claim 17, wherein the first seal housing includes:

a collector that is in close contact with the treatment container around the first opening and the second opening;

a first cylinder that is in connection with the collector in a communicated manner; and a second cylinder that is in connection with the collector in a communicated manner, wherein a part of the first shaft member is accommodated into the collector and the first cylinder, a part of the second shaft member is accommodated into the collector and the second cylinder, the first seal member is in close contact with an inner peripheral surface of the first cylinder, the second seal member is in close contact with an inner peripheral surface of the second cylinder, and the cooling unit is disposed adjacent to the collector.

19. The substrate treating apparatus according to claim 18, wherein the first cylinder is separable from the collector, and the second cylinder is separable from the collector.

20. The substrate treating apparatus according to claim 18, wherein the collector includes a first pipe that extends between the first shaft member and the second shaft member in a direction substantially orthogonal to the axis direction of the first shaft member.

21. A substrate treating apparatus, comprising:

a treatment container configured to treat a substrate, the treatment container having:

a casing;

a lid removably attached to the casing;

a transportation port through which the substrate is passed;

a shutter for opening and closing the transportation port;

a first opening; and a second opening;

a first shaft member that is disposed between an interior of the treatment container and an exterior of the treatment container through the first opening, and that is configured to reciprocate in an axis direction of the first shaft member;

a second shaft member that is disposed between the interior of the treatment container and the exterior of the treatment container through the second opening, and that is configured to reciprocate in an axis direction of the second shaft member; and a sealing mechanism configured to seal the first opening while allowing reciprocation of the first shaft member, wherein the sealing mechanism comprises:

a first seal housing that is disposed in the exterior of the treatment container, that is in close contact with the treatment container around the first opening, that accommodates a part of the first shaft member, that is in close contact with the treatment container around the second opening, and that accommodates a part of the second shaft member;

a first seal member that is in close contact with an inner peripheral surface of the first seal housing, and that is in close contact with an outer peripheral surface of the first shaft member so as to be slidable relative to the first shaft member; and a second seal member that is in close contact with an inner peripheral surface of the first seal housing, and is in close contact with an outer peripheral surface of the second shaft member so as to be slidable relative to the second shaft member, the first seal housing includes:

a collector that is in close contact with the treatment container around the first opening and the second opening;

a first cylinder that is in connection with the collector in a communicated manner; and a second cylinder that is in connection with the collector in a communicated manner, a part of the first shaft member is accommodated into the collector and the first cylinder, a part of the second shaft member is accommodated into the collector and the second cylinder, the first seal member is in close contact with an inner peripheral surface of the first cylinder, and the second seal member is in close contact with an inner peripheral surface of the second cylinder.

22. The substrate treating apparatus according to claim 21, further comprising:

a first exhaust port that is in connection with the first seal housing in a communicated manner, and that is configured to exhaust gas within the first seal housing, wherein the first exhaust port is in connection with the collector in a communicated manner.

23. The substrate treating apparatus according to claim 21, further comprising:

a cooling unit disposed adjacent to the sealing mechanism, wherein the cooling unit is disposed adjacent to the collector.

* * * * *